(12) United States Patent
Gasanov et al.

(10) Patent No.: US 6,629,304 B1
(45) Date of Patent: Sep. 30, 2003

(54) CELL PLACEMENT IN INTEGRATED CIRCUIT CHIPS TO REMOVE CELL OVERLAP, ROW OVERFLOW AND OPTIMAL PLACEMENT OF DUAL HEIGHT CELLS

(75) Inventors: Elyar E. Gasanov, Moscow (RU); Andrej A. Zolotykh, Fryazino (RU); Aiguo Lu, Cupertino, CA (US); Ivan Pavisic, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 77 days.

(21) Appl. No.: 09/955,698

(22) Filed: Sep. 19, 2001

(51) Int. Cl.[7] .................................................. G06F 9/45
(52) U.S. Cl. .............................. 716/10; 716/9; 716/11
(58) Field of Search .......................... 716/9, 10, 8, 11, 716/12, 1, 2, 18, 19

(56) References Cited

U.S. PATENT DOCUMENTS

| | | | | |
|---|---|---|---|---|
| 5,561,607 A | * | 10/1996 | Makofske | ...................... 716/17 |
| 6,026,223 A | | 2/2000 | Scepanovic et al. | ... 395/500.11 |
| 6,128,767 A | * | 10/2000 | Chapman | ........................ 716/1 |
| 6,385,761 B1 | * | 5/2002 | Breid | ........................... 716/11 |
| 6,405,356 B1 | * | 6/2002 | Yang | ............................. 716/10 |
| 6,415,425 B1 | * | 7/2002 | Chaudhary et al. | ............. 716/9 |
| 6,446,239 B1 | * | 9/2002 | Markosian et al. | ............. 716/2 |

* cited by examiner

*Primary Examiner*—Vuthe Siek
*Assistant Examiner*—Binh C. Tat
(74) *Attorney, Agent, or Firm*—Westman, Champlin & Kelly

(57) ABSTRACT

Cell overlap is removed from rows during a cell placement procedure for an integrated circuit chip. The rows are partitioned into subrows so that cells in each subrow have a common characteristic vector. Cell overflow is removed from each of the subrows by moving a cell of an overflowed row or exchanging two cells, at least one of which is in the overflowed subrow. The half-cells of the dual height cells are moved to cell positions in a suitable pair of rows based on a calculated movement penalty. The movement is accomplished to align the half-cells and minimize the penalty. In preferred embodiments, the process is carried out by a computer under control of a computer program.

25 Claims, 9 Drawing Sheets

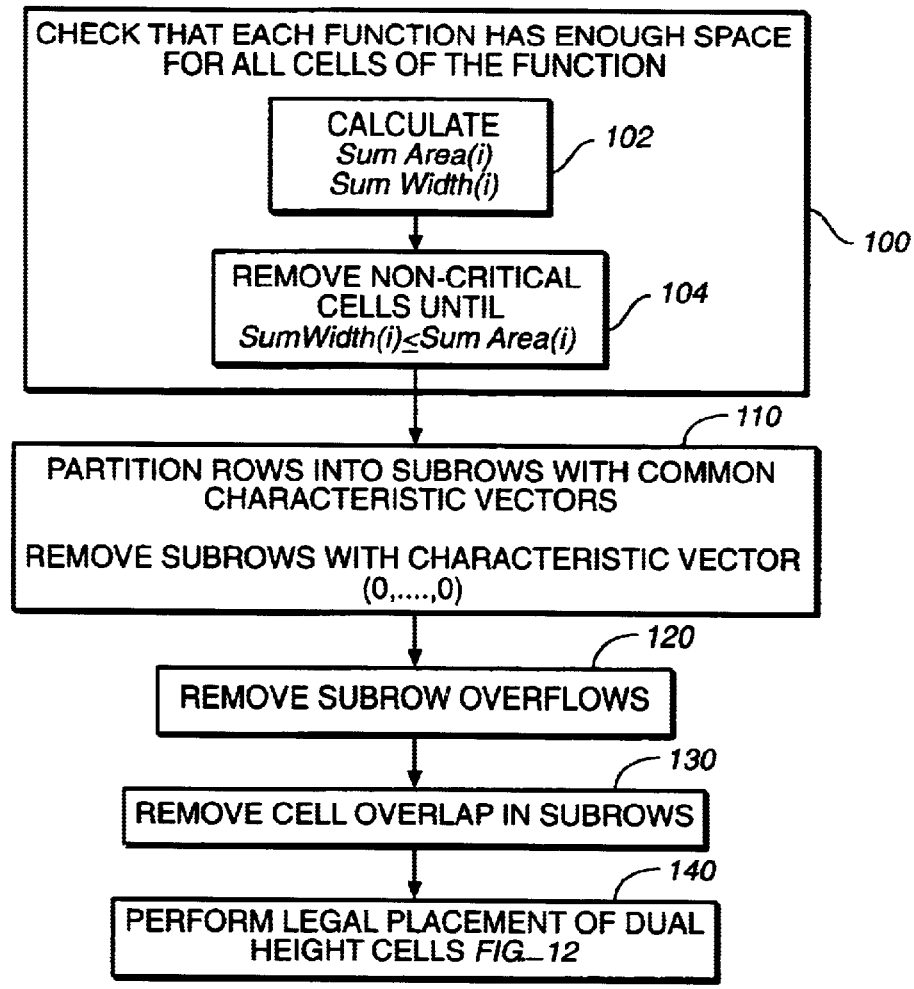
FIG._1
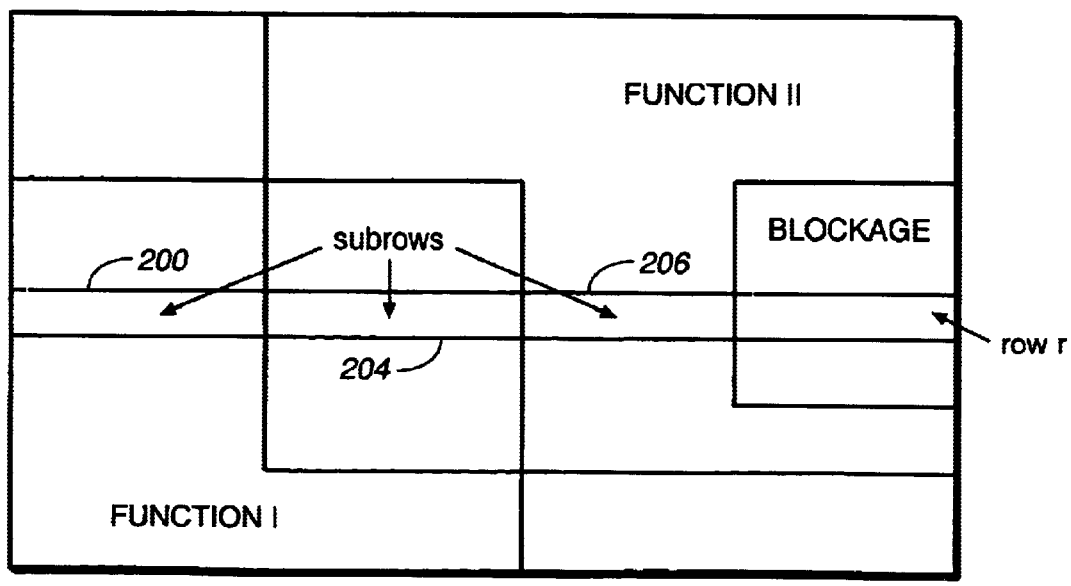
FIG._2

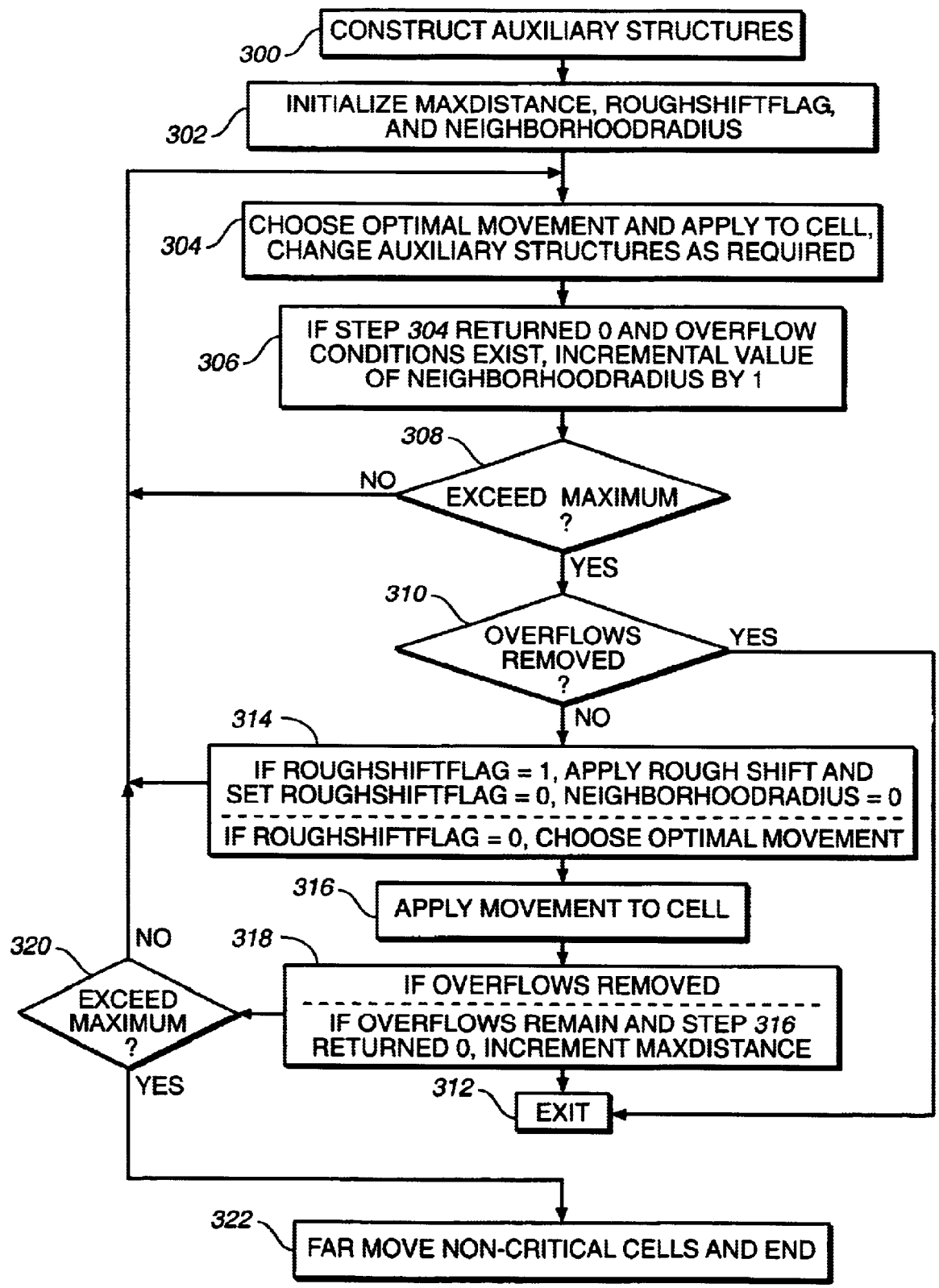
FIG._3

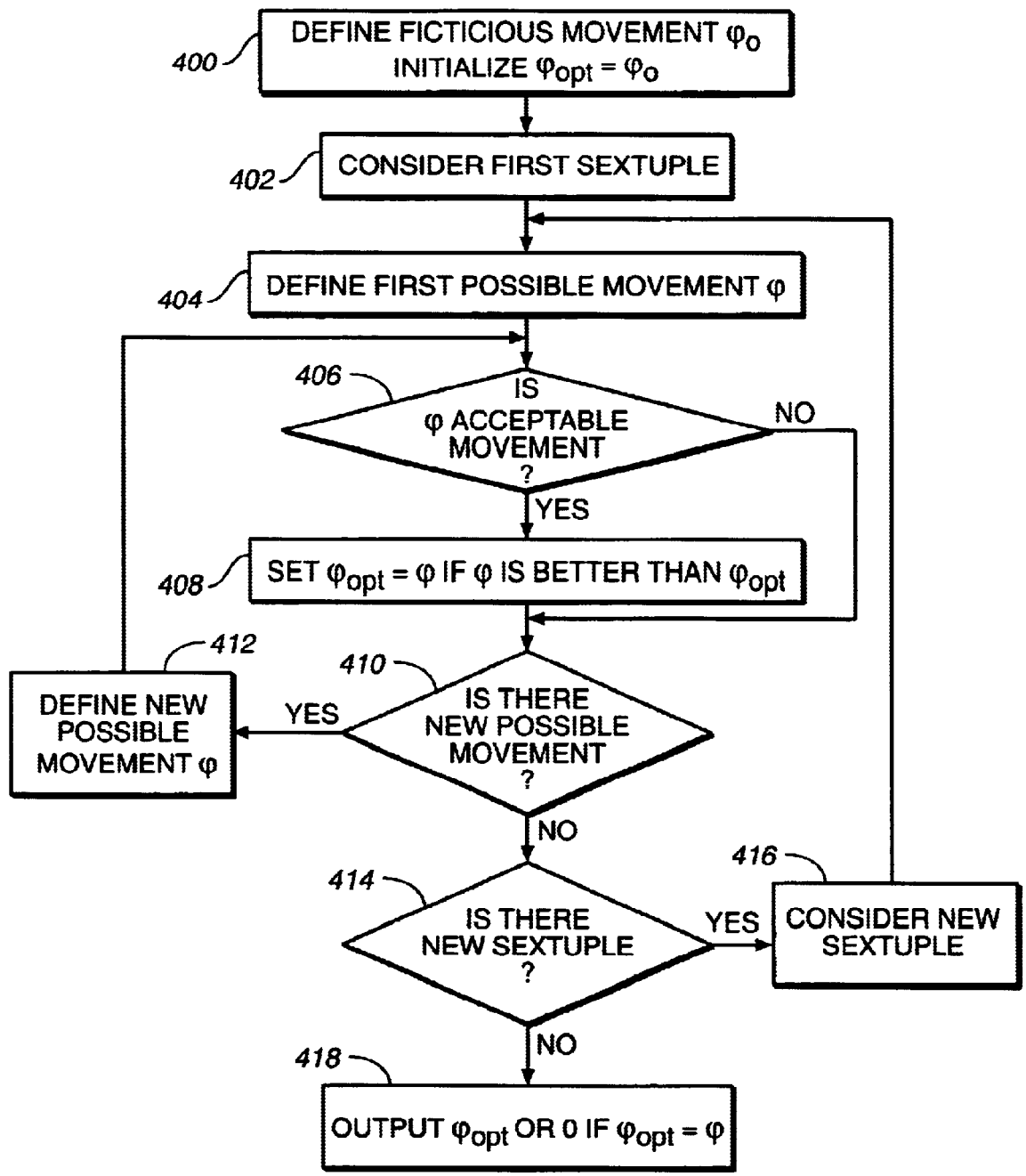
FIG._4

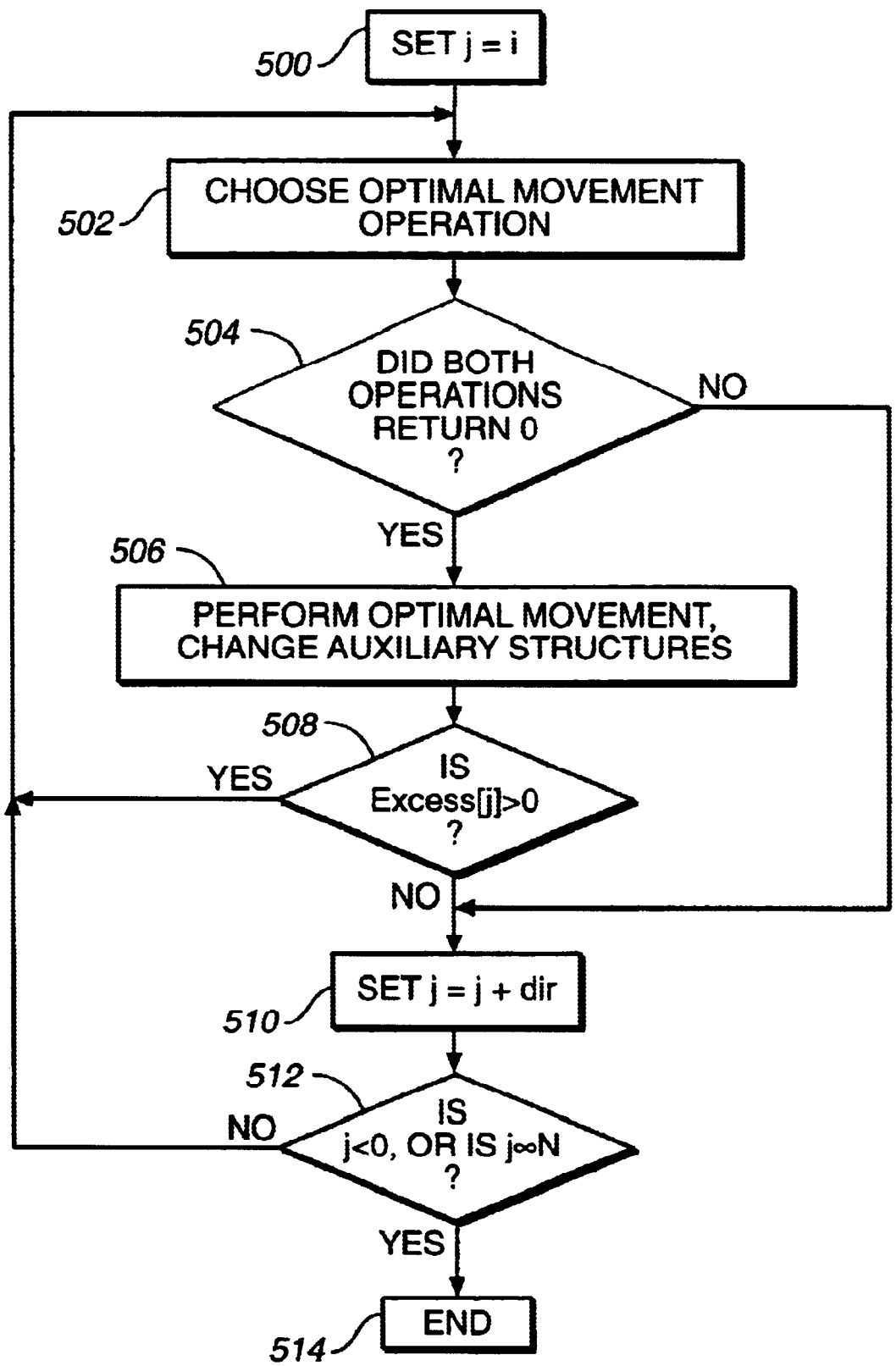
FIG._5

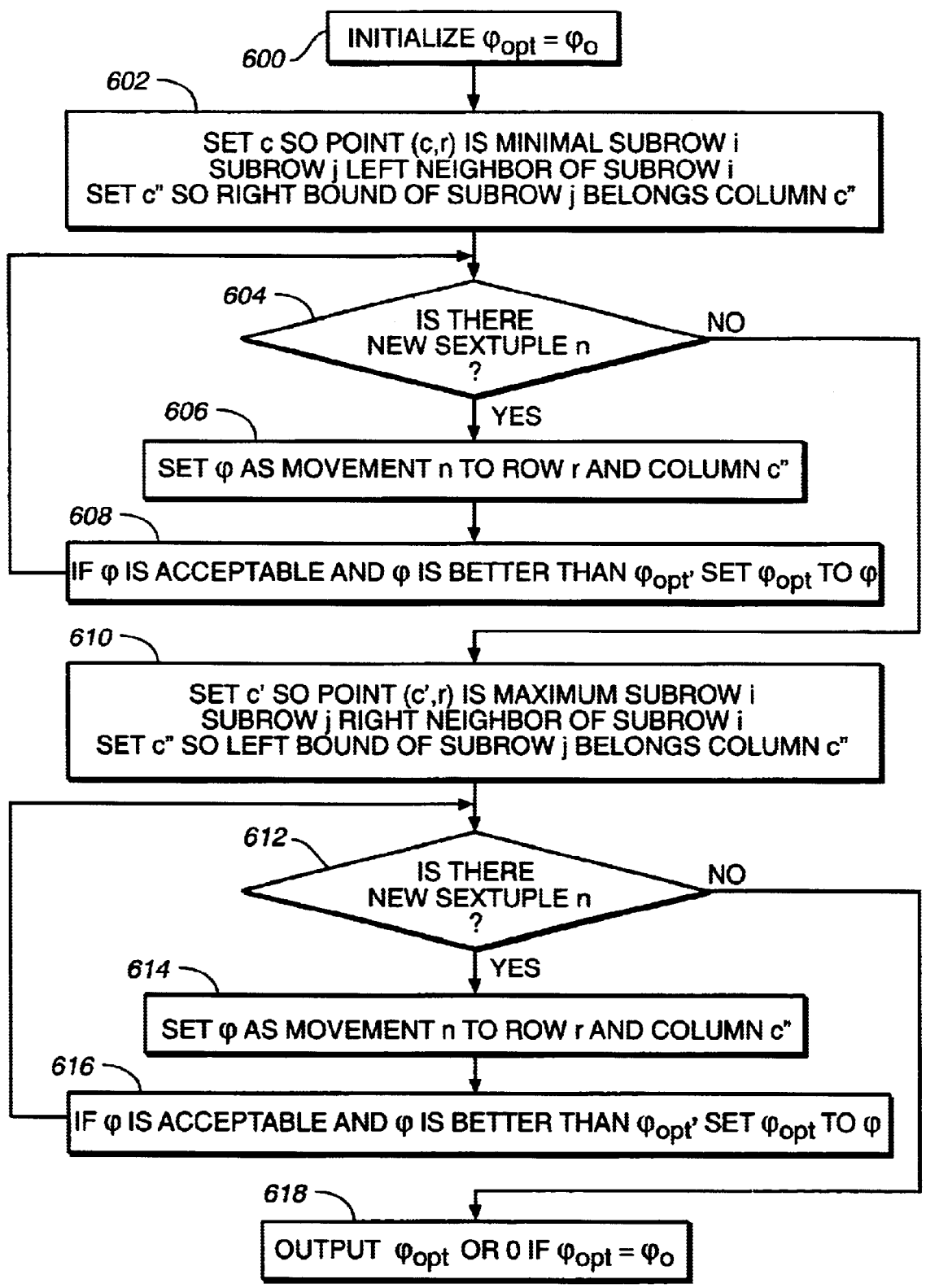
FIG._6

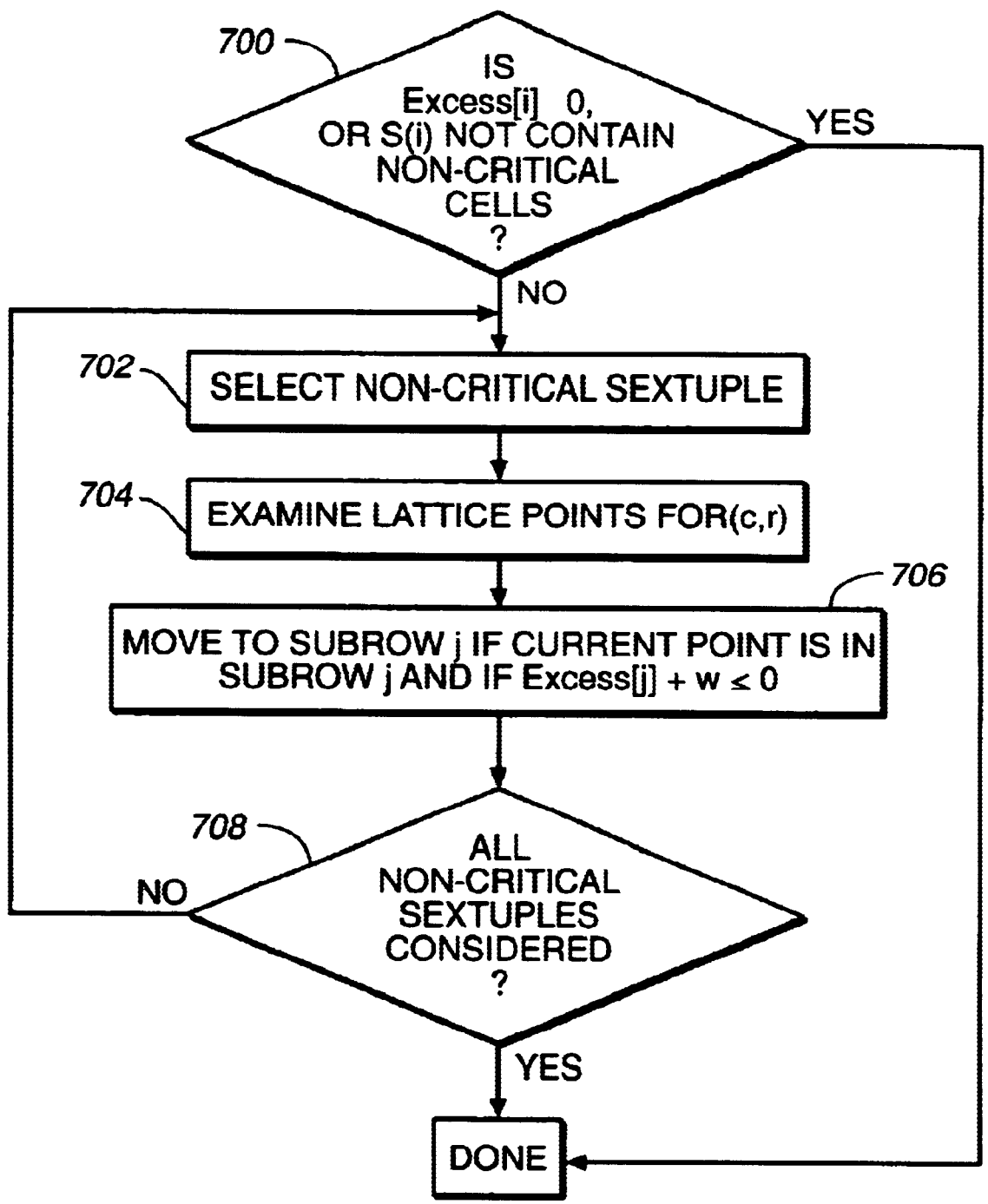
FIG._7

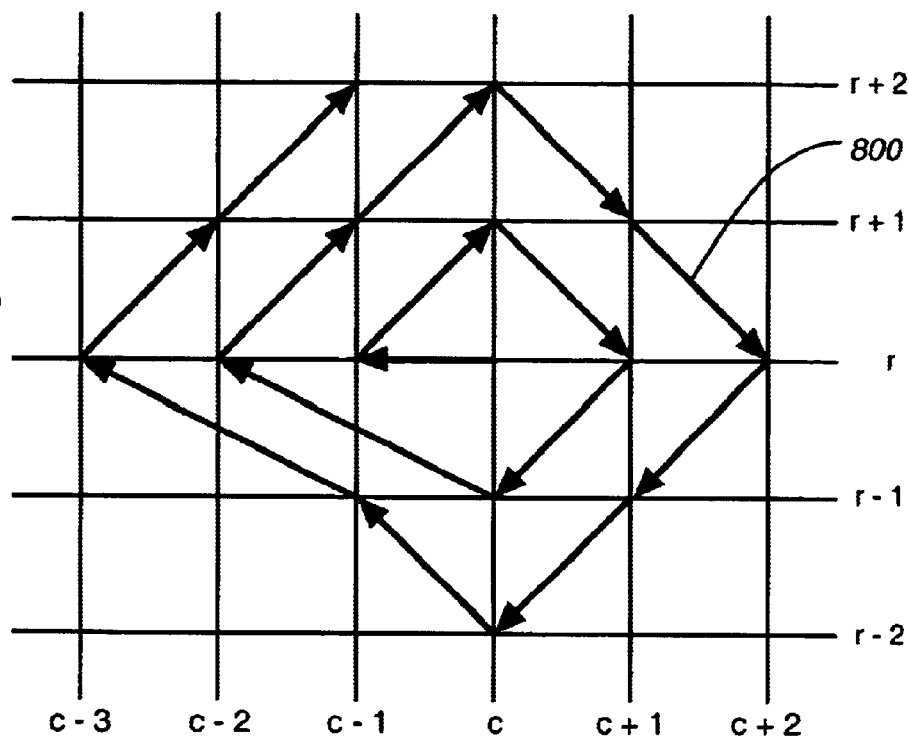
FIG._8
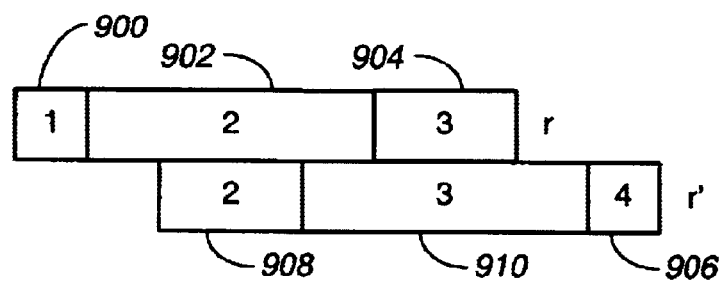
FIG._9
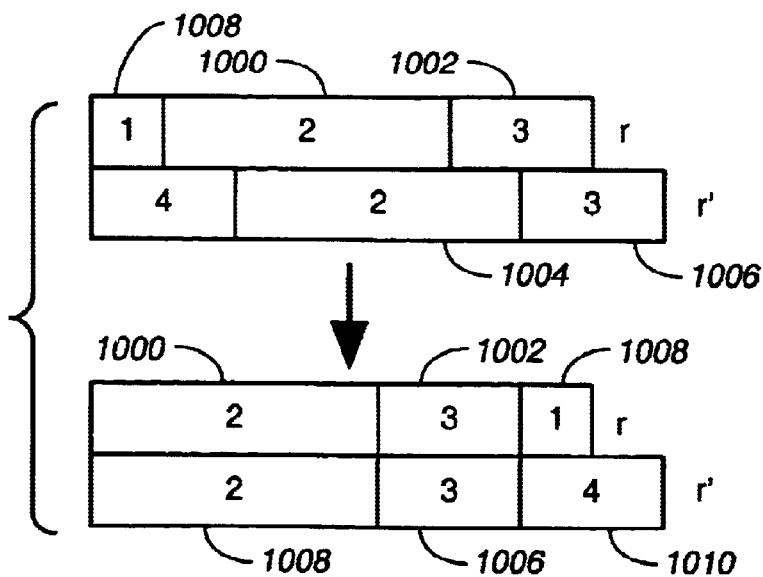
FIG._10

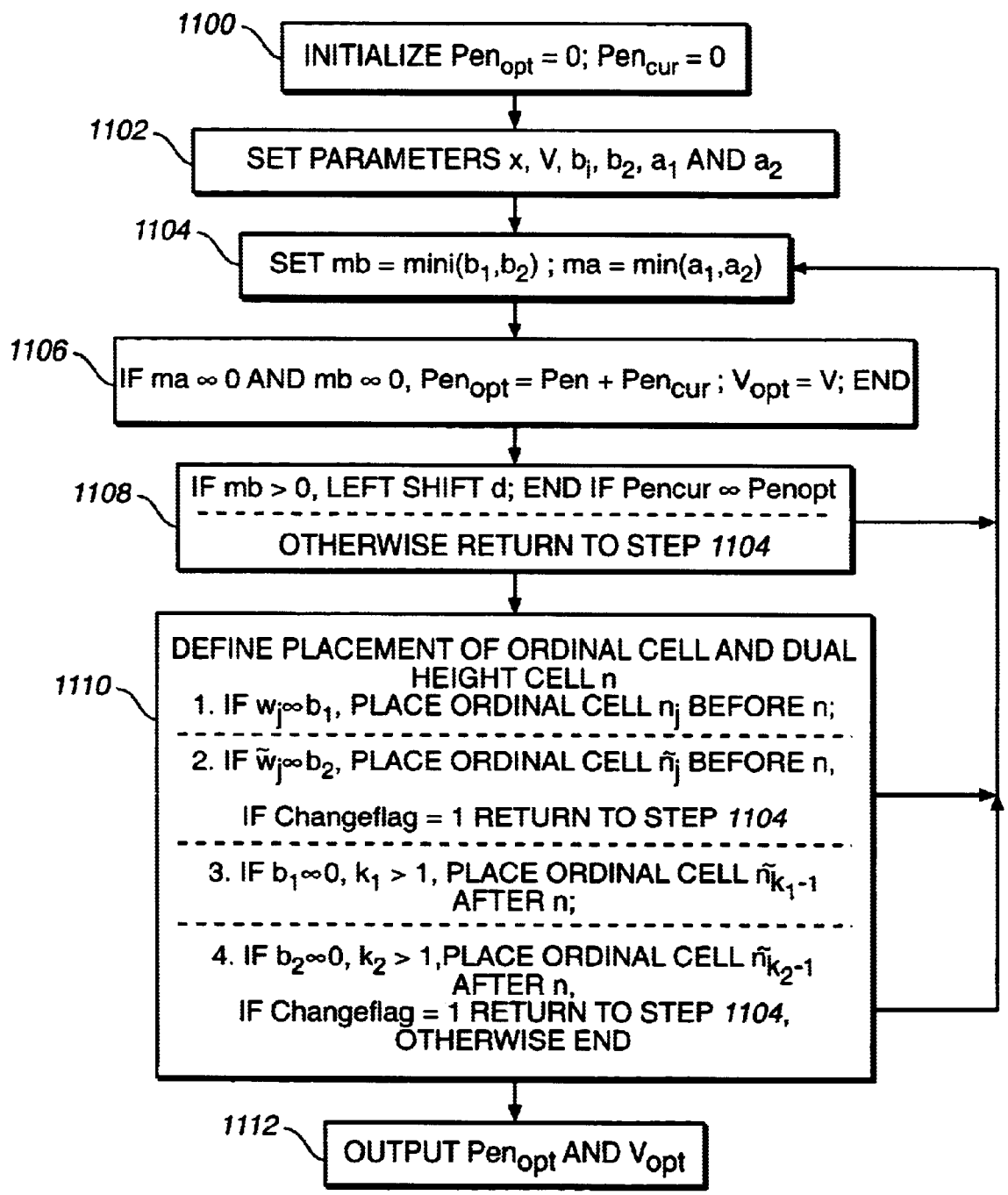
FIG._11

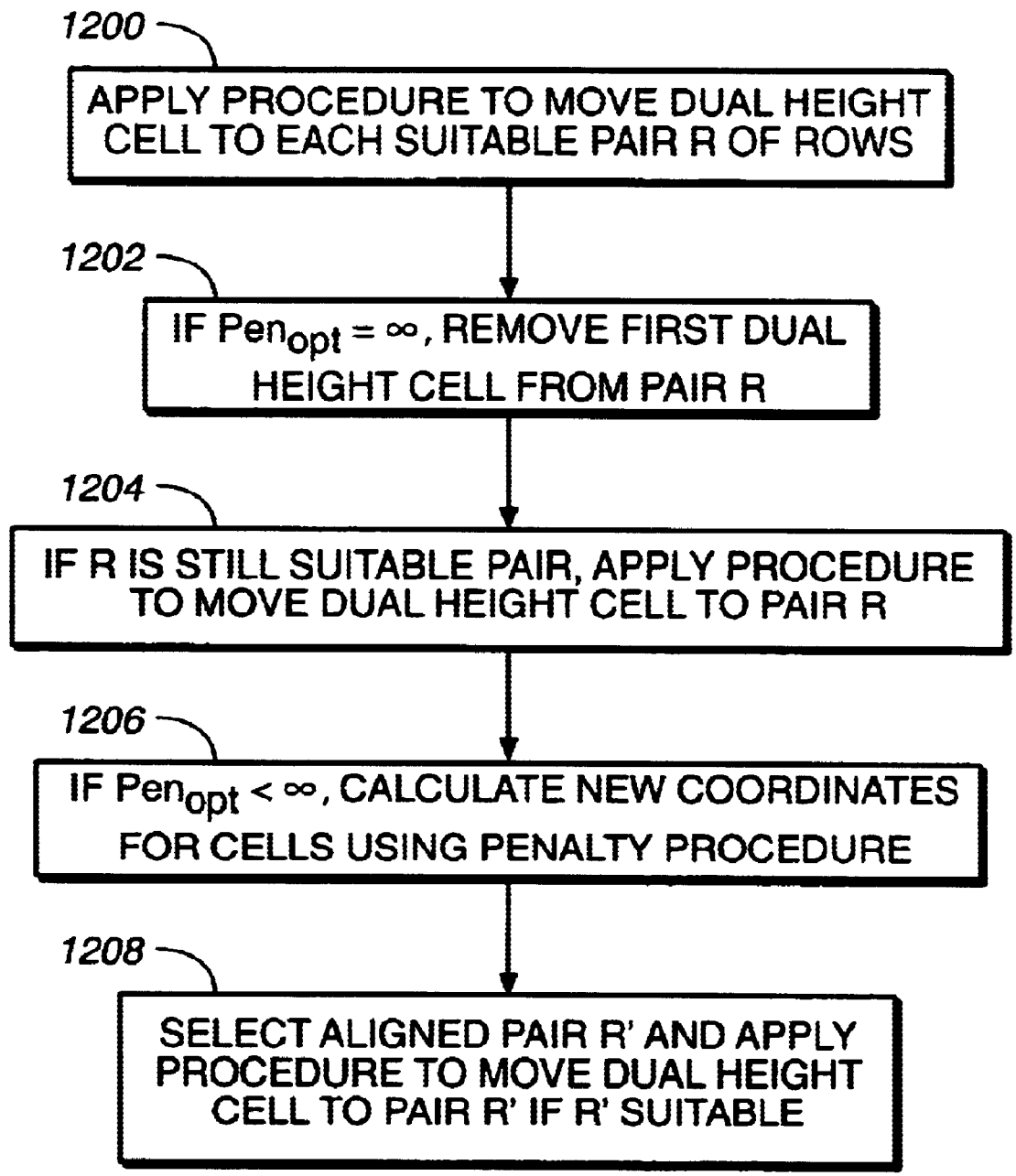
FIG._12

CELL PLACEMENT IN INTEGRATED CIRCUIT CHIPS TO REMOVE CELL OVERLAP, ROW OVERFLOW AND OPTIMAL PLACEMENT OF DUAL HEIGHT CELLS

FIELD OF THE INVENTION

This invention is directed to cell placement in integrated circuit (IC) chips, and particularly to removing cell overlaps and row overflows and to placement of dual height cells during design of IC chips.

BACKGROUND OF THE INVENTION

IC chips comprise plural cells each consisting of one or more circuit elements, such as transistors, capacitors and other basic circuit elements, grouped to perform a specific function. Each cell has one or more pins that are connected by wires to one or more pins of other cells of the chip. A net is the set of pins connected by the wire; a netlist is a list of nets of the chip. Each cell represents a single element, such as a gate; or several elements interconnected in a standardized manner to perform a specific function. Cells that consist of two or more interconnected gates or elements are also available as standard modules in circuit libraries. During chip layout, the cells may be treated as having a rectangular outline. Ordinal cells usually have the same height, although the width of the cells may be different.

All ordinal cells are arranged in rectangular regions along rows on the chip. The height of each row is equal to the common height of the ordinal cells; the length of a row is usually equal to the width of the chip. The rows define columns on the chip extending orthogonal to the rows; the column height is usually equal to the sum of the height of cells in the column.

A chip may contain several million transistors. Ordinarily, computer-aided design techniques cannot layout the entire circuit due to limitations on the memory space as well as the computation power available. Therefore, the layout is normally partitioned by grouping the components into blocks such as subcircuits and modules. The actual partitioning process considers many factors, such as the number and size of the blocks and number of interconnections between the blocks.

The output of partitioning is a set of blocks, along with the interconnections required between blocks. In large circuits, the partitioning process is often hierarchical and at the topmost level a circuit can have between 5 and 25 blocks. Each block is then partitioned recursively into smaller blocks. These blocks are called functions. Consequently, each function has a region of the chip where the cells of the function are placed. The regions of the different functions can be intersected.

Cells are -placed into the regions associated with the function. The different function regions can be intersected, and a characteristic vector $(x_1, \ldots, x_n)$ can be assigned to each point of the chip, where n is the number of the functions; xi is equal to 1 if this point belongs to the i-th function and xi is equal to 0 if the point does not belong to the i-th function. Each row of the chip can be partitioned into subrows such that different subrows contain points with different characteristic vectors, and all points of one subrow have the same characteristic vector (this vector is called the characteristic vector of the subrow).

In some cases, large cells (called dual height cells) may be appear as two or more ordinal cells (called half-cells) of neighboring rows, where the half-cells have common horizontal (x-direction) sides. Consequently, the heights of dual-height cells are usually some multiple of the height of ordinal cells.

Chips are designed using computer-aided design (CAD) techniques. Where a hierarchical placement is employed, timing resynthesis procedures are employed prior to final cell placement. In some cases, uniform density control procedures are applied during resynthesis to prevent the chip from having overflowed regions and cell congestion. However, these procedures do not prevent creation of cell overlaps in the chip.

A cell overflow condition occurs where the sum of the heights of cells assigned to a column exceeds the height of the column. Where there is no cell overflow in a given subrow, cell overlap can be removed using the cell placement technique described by Scepanovic et al. in U.S. Pat. No. 6,026,223 granted Feb. 15, 2000 for "Advanced Modular Cell Placement System with Overlap Remover with Minimal Noise" and assigned to the same assignee as the present invention. However, the overlap removal technique described by Scepanovic et al. is not altogether effective where subrows contain cell overflow. Moreover, after resynthesis and overlap removal, half-cells of a dual height cell may have different x coordinates. Consequently, it becomes necessary to assign new positions to the half-cells.

SUMMARY OF THE INVENTION

In one embodiment of the invention, cell overlap is removed from rows during a cell placement procedure for an integrated circuit chip. The rows are partitioned into subrows so that each subrow contains cells having a common characteristic vector. Cell overflow is removed from each of the subrows. Cell overlap is removed from each of the subrows, and the positions of half-cells of dual height cells are adjusted in adjacent rows for minimal offset of the half-cells.

In some embodiments, the half-cells of the dual height cells are moved to cell positions in a suitable pair of rows. A penalty is calculated based on a distance between the half-cells of a dual height cell before and after the move. A dual height cell is removed from the pair of rows if the calculated penalty is not acceptable. New row coordinates are calculated for the half-cells in the pair of rows if the penalty is acceptable, whereupon the pair of rows are aligned to minimize the penalty and the half-cells of the dual height cells are moved to cell positions in the pair of rows to minimize the penalty.

In other embodiments cell overflows are removed from a row. A movement is chosen, for example a movement of one cell or an exchange of two cells, each overflowed subrow. If the incremented size of the subrows does not exceed the maximum size and the overflows are removed, the movement is performed. Otherwise the size of the subrow containing overflows is incremented, and another movement is chosen.

In preferred embodiments, the invention is manifest in a computer readable program containing code that causes the computer to carry out the steps of the processes described.

BRIEF DESCRIPTION OF THE DRAWINGS

FIG. 1 is a flow chart illustrating the process of overlap removal in accordance with one embodiment of the present invention.

FIG. 2 illustrates a portion of a chip layout to illustrate certain aspects of the overlap removal process of FIG. 1.

FIG. 3 is a flow chart illustrating a process to remove row overflows in the overlap remover of FIG. 1.

FIGS. 4–7 are flow charts of various subprocesses employed in the row overflow removal illustrated in FIG. 3.

FIG. 8 is a diagram useful in an understanding of movement of non-critical cells in the subprocess illustrated in FIG. 7.

FIGS. 9 and 10 are diagrams useful in understanding the problem of placement of dual height cells.

FIG. 11 is a flow chart illustrating a subprocess employed in the process to place dual height cells.

FIG. 12 is a flow chart illustrating a process to place dual height cells.

DETAILED DESCRIPTION OF THE PREFERRED EMBODIMENTS

FIG. 1 illustrates the steps of one embodiment of overlap removal for chip designs having dual height cells place with a hierarchical placement procedure in accordance with the present invention. At step 100, each function is checked to make certain that the function has enough space for all cells of the function. A vertical grid line with an x coordinate X belongs to the subrow ($x_{min}$, $y_{min}$, $x_{max}$, $y_{max}$) if $x_{min} \leq X \leq x_{max}$ and the segment $\{(X,y)|y_{min} \leq y \leq y_{max}\}$ does not intersect any blockage. A blockage is a region of a chip where ordinal cells cannot be placed. The number of vertical grid lines belonging to a subrow is the width of the subrow. If $Cell_{xmin}$ and $Cell_{max}$ are the x coordinates of the outline of some cell and $D_{vert}$ is the distance between neighbor vertical grid lines then the value $$\frac{Cell_{xmax} - Cell_{xmin}}{D_{vert}}$$

is the width of the cell.

A cell belongs to a given region if the cell coordinates belong to that region. Each row has a specific characteristic called an angle. An angle can be equal to 0° or 180°. The angles of all cells belonging to some row must be equal to the angle of the row. Dual height cell of a chip can be placed in two neighbor rows only if their outlines have a common horizontal side and the first of these rows has an angle of 180°, and the second row has an angle of 0°. Each fixed cell is treated as a blockage.

Two characteristics are assigned to each cell n:

$$CellRamptimeViolation(n) = \max\{CellCapacity_i - CellMaxCap_i | i = 1, \ldots, k\}$$

and $$CellTime(n) = \max\{CellPinArrTime_i + CellPinDepTime_i | i = 1, \ldots, m\},$$

where k is the number of the output pins of the cell n, $CellMaxCap_i$ is the maximal allowed capacity of the net driven by the i-th output pin of the cell n, $CellCapacity_i$ is the capacity of the net driven by the i-th output pin of the cell n, m is the number of the pins of the cell n, $CellPinArrTime_i$ is the maximal arrival time of the i-th pin of the cell n, and $CellPinDepTime_i$ is the maximal departure time of the i-th pin of the cell n. One method of calculating the capacity of a net and the departure and arrival times is more fully described in U.S. application Ser. No. 09/677,475 filed Oct. 2, 2000 by Zolotykh et al. for "Method and Apparatus for Timing Driven Resynthesis" and assigned to the same assignee as the present invention.

A cell n is considered critical if either $$CellRamptimeViolation(n) > -\xi_1, \text{ or}$$

$$CellTime(n) > CriticalTime - \xi_2,$$

where $\xi_1$, $\xi_2$ and CriticalTime are parameters of the procedure.

At step 102, the total width SumWidth(i) of if all cells is calculated for each function i, and the total width of all subrows of each function region is calculated and denoted by SumArea(i). All chip functions are examined. At step 104, if SumWidth(i)>SumArea(i) for some function i, non-critical cells of the function are randomly removed, one at a time. With each removal iteration, SumWidth(i) is reduced by the width of the removed cell. The removal process continues until SumWidth(i)≦SumArea(i). The coordinates of the removed cells are not changed.

At step 110, the cell rows are partitioned into subrows, taking into account characteristic vectors. All chips rows are examined individually. For each row a set of integers X is created. Initially, X is assigned the value $\{x_{min}, x_{max}\}$, where $x_{min}$ and $x_{max}$ are the x coordinates of the current row. Then all function regions and blockages are examined. If the rectangle of a region or a blockage intersects the current row, the x coordinates of this rectangle are added to set X. Set X is then sorted in increasing order. The sorting results in a set $X=\{x_1, \ldots, x_k\}$. Consequently, for any $i \in \{1, \ldots, k-1\}$ and for all points of the row with x coordinates between $x_i$ and $x_{i+1}$, the characteristic vectors of these points are the same.

Each region of the row between the vertical lines with the x coordinates $x_i$ and $x_{i+1}$, (i=1, ..., k-1) is identified as a subrow. The characteristic vector is calculated, and all subrows having a characteristic vector (0, ..., 0) are removed. An example of a row partition is illustrated in FIG. 2 where row r includes subrows 200, 202 and 204, and a blockage 206. Row r contains cells of functions I and II.

At step 120, subrow overflows are removed. All cells are examined individually. If a cell is outside its function region or outside the subrows the cell is moved to the closest subrow that belongs to the function region.

An auxiliary structure in the form of a sextuple (x, $x_{old}$, $r_{old}$, w, n, cr) is assigned to each cell, where x and $x_{old}$ are the x coordinates of the cell origin point, $r_{old}$ is the number of the row that contains this cell, w is the cell width, n is the cell number, cr is 1 if the cell is critical or cr is 0 if the cell is not critical. Sextuples (x, $x_{old}$, $r_{old}$, w, n, cr) and (x, $x_{old}$, $r_{old}$+1, w, n, cr) are assigned to dual height cells.

The number of subrows is N. For each i=1, ..., N, a set S.(i) of the sextuples is created. A sextuple is included to S(i) if the corresponding cell belongs to the i-th subrow. The sets S(i) of sextuples are sorted in increasing order of the field x. An auxiliary structure in the form of an array Excess[i] (i=1, ..., N) is assigned to each subrow. Excess[i]= SumSubrowCellWidth[i]−SubrowWidth[i], where SumSubrowCellWidth[i] is the total width of all cells of the i-th subrow and SubrowWidth[i] is the width of the i-th subrow. If Excess[i]>0 for some i, an overflow exists in the i-th subrow.

An overflowed subrow i is randomly chosen, and an attempt is made to move some sextuple from S(i) to a neighbor subrow j or to exchange a sextuple of S(i) with a sextuple of the neighbor subrow j to decrease the total overflow. If some sextuple is moved or exchanged, its field x is changed and the corresponding sets S(i), S(j), and the values Excess [i], Excess[j] are changed. If a sextuple corresponding to a dual height cell is moved, the other sextuple corresponding to this cell is also moved. The fields $x_{old}$ and $r_{old}$ of the sextuples are used to prevent movement of large distances between the new and the initial positions of the cell.

If overflow removal is not possible in some subrow i, a noncritical sextuple is randomly chosen and removed. Excess[i] is reduced by the width of the cell of the removed sextuple until Excess[i]≦0. The coordinates of the cells corresponding to the removed sextuple are not changed.

At step 130, overlap is removed from the subrows. Each subrow is considered individually. Overlaps are removed from each subrow, such as using the overlap removal technique described in the aforementioned Scepanovic et al. patent.

After the field x of the sextuples of S(i) is changed during overlap removal, the value of the field x saved in $x_{old}$ is restored for all critical sextuples of S(i). The overlap removal process described in the aforementioned Scepanovic et al. patent is repeated for the i-th subrow to reduce the shifts of the critical cells.

The cells are then considered individually to identify critical cells. The cr fields are changed for all critical sextuples and the value of the field x of this sextuple is saved in $x_{old}$. Then, the overlap removal process described in the Scepanovic et al. patent is repeated for all subrows.

If the design has no dual height cells the cell placement is a legal placement. If the design includes dual height cells, an additional step 140 is performed to achieve placement of dual height cells.

The problem related to dual height cells is that two sextuples corresponding to a dual height cell can have different values of the field x after overlap removal because these sextuples are placed in the neighbor subrows and the overlap removal step is applied to the subrows independently.

All pairs of subrows where dual height cells may be placed are examined. For each pair, the procedure of the placement of dual height cells is performed to find permutations of the sextuples of the pair of subrows. More particularly, for each dual height cell, the x coordinates of two sextuples corresponding to this cell become equal and the total distance between the initial and new positions of the cells of these subrows is close to the minimum. This procedure is described more fully below in FIG. 12. The result is a legal placement of the chip cells after the examination of all pairs.

FIG. 3 is a flow chart of the process of removing row overflow in the overlap remover. If a subrow has no cell overflow, the process described in the aforementioned Scepanovic et al. patent may be employed to remove the overlaps of the cells of the subrow. However, if cell overflow occurs, the process of FIG. 3 is employed to remove overflows from all subrows of the chip.

An auxiliary structure in the form of matrix FreeGrids [ColumnNumber][RowNumber] is created, with FreeGrids[i][j]=GridsNumber[i][j]−SumWidth[i][j], where GridsNumber[i][j] is the number of vertical grid lines belonging to the i-th column and the j-th row, SumWidth[i][j] is the total width of all cells belonging to the i-th column and the j-th row.

The chip may have some "gray boxes". A cell is a repeater if it is a buffer or an inverter. A gray box is a region where only the repeaters can be placed. If the chip has gray boxes then a GrayBox[ColumnNumber][RowNumber] matrix is created. If the point (ColumnCoordinate[i], RowCoordinate[j]) belongs to a gray box then GrayBox[i][j]=1, otherwise GrayBox[i][j]=0.

Each row has an angle equal to 0° or 180°. If the chip has dual height cells an array. DualChar[RowNumber] is created. If the i-th row angle of the dual height cell is 180°, the (i+1)-th row angle is 0° and its outlines have a common horizontal side, then DualChar[i]=1. If the i-th row angle is 0°, the (i−1)-th row angle is 180° and its outlines have a common horizontal side, then DualChar[i]=2. Otherwise, DualChar[i]=0.

As shown in FIG. 3, the process of removing row overflow begins at step 300 with the construction of auxiliary structures described above. If a cell is located outside its function region or outside the subrows then the cell is moved to the closest subrow that belongs to the function region. The process of FIG. 3 requires several sub-processes, including selection and definition of a movement operation, A. First Process to Compare Two Movement Operations Subrow i has x coordinates $x_{min}(i)$ and $x_{max}(i)$. Subrow j is included in the set of number of subrows $R_1(i, m)$ if subrow j belongs to one of rows r−m, r−m+1, . . . , r−1 and $$[x_{min}(j), x_{max}(j)] \cap [x_{min}(i), x_{max}(i)] \neq \emptyset.$$

Otherwise, subrow j is included in the set of numbers of subrows $R_2(i, m)$, if subrow j belongs to one of rows r+1, r+2, . . . , r+m and $$[x_{min}(j), x_{max}(j)] \cap [x_{min}(i), x_{max}(i)] \neq \emptyset.$$

By definition, $$NeighborhoodExcess_1(i, m) = \sum_{j \in R_1(i,m)} Excess[j],$$

$$NeighborhoodExcess_2(i, m) = \sum_{j \in R_2(i,m)} Excess[j], \text{ and}$$

$$NeighborhoodExcess(i, m) =$$

$$NeighborhoodExcess_1(i, m) + NighborhoodExcess_2(i, m) + Excess[i].$$

A movement operation Φ moves some cell n from the subrow i to the subrow j or exchanges two cells n and n' placed in the subrows i and j. Consequently, the auxiliary structures Excess[i] and Excess[j] are changed and become Excess'[i] and Excess'[j]. If a cell is moved from subrow i to subrow j, and w is the width of the cell, then Excess'[i]=Excess[i]−w, and Excess'[j]=Excess[j]+w.

If two cells of subrows i and j are exchanged, where w is the width of the first cell and w' is the width of the second cell, then Excess'[i]=Excess[i]−w +w', and Excess'[j]=Excess[j]+w−w'.

If a dual height cell in the i-th and i'-th subrows is moved to the j-th and j'-th subrows, then the excesses of these four subrows are changed. By definition, ExcessChange(Φ)=max(0, Excess[i])+max(0, Excess[j])−max(0, Excess'[i])−max(0, Excess'[j]).

In the dual height case,

ExcessChange(Φ)=max(0, Excess[i])+max(0, Excess[j])+max(0, Excess[i'])+max(0, Excess[j'])−max(0, Excess'[i])−max(0, Excess'[j])−max(0, Excess'[i'])−max(0, Excess'[j']).

Consequently,

NeighborhoodExcessChange($\Phi$, m)=NeighborhoodExcess(i, m)−NeighborhoodExcess(j, m).

If cell n is moved from row r, column c to row r', column c' by the movement operation $\Phi$, then FreeGrids[c][r] and FreeGrids[c'][r'] are changed and become FreeGrids'[c][r] and FreeGrids'[c'][r']. By definition, FreeGridsChange($\Phi$). FreeGrids[c][r]+FreeGrids[c'][r']−FreeGrids'[c][r]−FreeGrids'[c'][r'], and $$DistanceChange(\varphi) = |RowCoordinate[r] - y_0| +$$
$$|ColumnCoordinate[c] - x_0| -$$
$$|RowCoordinate[r'] - y_o| -$$
$$|ColumnCoordinate[c'] - x_0|,$$

where $(x_0, y_0)$ is the initial position of cell n (as identified from $x_{old}$ and $r_{old}$ of the corresponding sextuple).

If $\Phi$, $\Phi'$ are two movement operations, and NeighborhoodRadius is some integer parameter. Operation $\Phi$ is considered better than $\Phi'$ if one of the following four conditions is satisfied:
1) ExcessChange($\Phi$)<ExcessChange($\Phi'$);
2) ExcessChange ($\Phi$)=ExcessChange($\Phi'$), and NeighborhoodExcessChange($\Phi$, NeighborhoodRadius) <NeighborhoodExcessChange($\Phi'$, NeighborhoodRadius);
3) ExcessChange($\Phi$)=ExcessChange($\Phi'$), and NeighborhoodExcessChange($\Phi$, NeighborhoodRadius)= NeighborhoodExcessChange($\Phi'$, NeighborhoodRadius), and FreeGridsChange($\Phi$)<FreeGridsChange($\Phi$);
4) ExcessChange($\Phi$)=ExcessChange($\Phi'$) and NeighborhoodExcessChange($\Phi$, NeighborhoodRadius)= NeighborhoodExcessChange($\Phi'$, NeighborhoodRadius), and FreeGridsChange($\Phi$)=FreeGridsChange($\Phi'$), and DistanceChange($\Phi$)<DistanceChange($\Phi'$).

Optimal Movement of Cell from Overflowed Subrow to Neighbor Row

A movement operation p that moves cell n from row r, column c to row r', column c' is acceptable if the following five conditions are satisfied:

1) $0 \leq r' <$ RowNumber,
2) $r_{old} - r' \leq$ MaxDistance,
3) $0 \leq c' <$ ColumnNumber,
4) FunctionRegion[m][c'][r']=1, and
5) either GrayBox[c'][r']=0 or cell n is a buffer or an inverter, except that if cell n is a dual height cell then additionally 6) DualChar[r]=DualChar[r'], where m is the number of the cell function, $r_{old}$ is the initial row number of the cell ($r_{old}$ is taken from the sextuple corresponding to the cell), and MaxDistance is a parameter.

FIG. 4 is a flow chart of the process of optimal movement of cell n from an overflowed subrow i of row r to a neighbor row. At step 400, a fictitious movement operation $\Phi_0$ is created as ExcessChange($\Phi$)=0, NeighborhoodChange($\Phi_0$, NeighborhoodRadius)=0.

FreeGridsChange($\Phi_0$)=0, and

DistanceChange($\Phi_0$)=0.

An optimal movement operation $\Phi_{opt}$ is initialized at $\Phi_{opt} = \Phi_0$.

All of the sextuples of S(i) are examined individually. At step 402, the sextuple (x, $x_{old}$, $r_{old}$, w, n, cr) is the currently considered sextuple with x belonging to column c. If n is an ordinal cell r'=r−1; if n is a dual height cell r'=r−2.

At step 404, a movement operation $\Phi$ is considered that moves cell n to row r', column c. If $\Phi$ is an acceptable movement at step 406, $\Phi$ and $\Phi_{opt}$ are compared at step 408 to identify if $\Phi$ is better than $\Phi_{opt}$, as describe in Section A. If $\Phi$ is better than $\Phi_{opt}$ then $\Phi_{opt}$ is set to $\Phi$.

There are two possible movement operations that move the cell to a neighbor row. At step 410 $\Phi$ is a first movement operation if r'=r−1 or r'=r−2, and the process skips to step 412. At step 412, r' is set to r+1 if n is an ordinal cell or r' is set to r+2 if n is a dual height cell. A movement operation $\Phi$ is considered that moves cell n to row r', column c, and the process loops back to step 406. At step 410 $\Phi$ is a second movement operation if r'=r+1 or r'=r+2, and the process skips to step 414.

If at step 414 sextuples remain to be considered, a new sextuple is considered at step 416 and the process loops back to step 404. The process continues to loop through steps 404–414 until all of the sextuples have been considered.

When all of the sextuples have been considered through step 414, the process continues to step 418 where the procedure returns 0 if $\Phi_{opt} = \Phi_0$. If $\Phi_{opt} \neq \Phi_0$, the procedure returns $\Phi_{opt}$.

C. Optimal Exchange of Two Cells of Neighbor Rows

The flow chart of FIG. 4 can also be used to describe the process of an optimal exchange of two cells n and n' between neighbor rows r and r'. At step 400, the fictitious movement $\Phi_0$ is defined, and the optimal movement operation $\Phi_{opt}$ is initialized as described above.

All of the sextuples of S(i) are examined individually. At step 402, the sextuple (x, $x_{old}$, $r_{old}$, w, n, cr) is the currently considered sextuple with x belonging to column c. If n is an ordinal cell r' =r−1; if n is a dual height cell r=r'−2. Subrow j contains point (ColumnCoordinate[c], RowCoordinate[r']). If (x', $x'_{old}$, $r'_{old}$, w', n', cr') is a sextuple of S(j) and $\Phi$ is a movement operation that moves cell n to row r', column c, and that moves cell n' to row r, column c, then the exchange movement operation $\Phi$ is possible for cell n if x' belongs to column c.

At step 404, a first possible movement operation $\Phi$ is considered. The process of steps 406–412 is repeated as described above for each possible exchange movement operation. At step 410, if r'=r−1 or r'=r−2 and all possible movement operations are considered, then r' is set to r+1 if n is an ordinal cell, or to r+2 if n is a dual height cell, and the process loops back to step 406. If at step 410 r'=r+1 or r'=r+2 and all possible movement operations are considered, then the process skips to step 414.

When all of the sextuples have been examined through step 414, the process continues to step 418 where the procedure returns 0 if $\Phi_{opt} = \Phi_0$. If $\Phi_{opt} \neq \Phi_0$, the procedure returns $\Phi_{opt}$.

D. Second Process to Compare Two Movement Operations

If a movement operation $\Phi$ moves cell n having a width w, then Width Changer($\Phi$)=w. If $\Phi'$ exchanges cells n and n' having a width w', then Width Change($\Phi$)=w−w'. An integer W and movement operations $\Phi$ and $\Phi'$ are inputs of the process.

If WidthChange($\Phi$)<0, then $\Phi$ is worse than $\Phi'$. If WidthChange($\Phi$)$\geq$0 calculate d=|W−WidthChange($\Phi$)|−|W−WidthChange($\Phi'$)|.

If d<0 then $\Phi$ is better than $\Phi'$. If d>0 then $\Phi'$ is better than $\Phi$. If d=0 then operation $\Phi$ is better than $\Phi'$ if one of the following conditions is satisfied 1) DistanceChange($\Phi$)<DistanceChange($\Phi'$);
2) DistanceChange($\Phi$)=DistanceChange($\Phi'$) and ExcessChange($\Phi$)<ExcessChange($\Phi'$).

E. Rough Shifting Subrow Overflows

If Excess[i]≦0 there is nothing to do and the procedure ends, where i is the input subrow.

Otherwise, $m_1$ is the minimal integer such that NeighborhoodExcess$_1$(i, $m_1$)+Excess[i]≦0. If NeighborhoodExcess$_1$(i, $m_1$)+Excess[i]>0 for all m then $m_1=\infty$. $m_2$ is the minimal integer such that NeighborhoodExcess$_2$(i, $m_2$)+Excess[i]≦0. If NeighborhoodExcess$_2$(i, $m_2$)+Excess[i]>0 for all m then $m_2=\infty$. If $m_1=\infty$ and $m_2=\infty$, the procedure ends.

Otherwise, dir is set equal to −1 if $m_1<m_2$ or to +1 otherwise. As shown by the flow chart of FIG. 5, at step 500, j is set equal to i. At step 502, the processes to choose the optimal movement operation described above are applied to subrow j. The procedure described in Section D is used with the procedures described in Sections B and C, and Excess[j] is used as the input parameter W of procedure described in Section D. If at step 504 both procedures described in Sections B and C return 0, the process skips to step 510. Otherwise, at step 506, the chosen optimal movement operation is performed and the corresponding items of the auxiliary structures, particularly Excess[j] are changed. At step 508, if Excess[i]>0 the process returns to step 502. Otherwise, at step 510 j is set equal to j+dir. If at step 512 j<0 or j≧N, where N is the number of subrows, the process ends. Otherwise the process loops back to step 502.

F. Optimal Movement of Cell from Overflowed Subrow to Neighbor Subrow Where Both Subrows Belong to the same Row FIG. 6 is a flow chart of the operation to select the optimal movement of a -cell from an overflowed subrow to a neighbor subrow, where both subrows belong to the same row. At step 600, the optimal movement operation $\Phi_{opt}$ is initialized as $\Phi_0$, where $\Phi_0$ is the fictitious movement operation as described above. At step 602, c is set to the minimal number such that the point (ColumnCoordinate[c], RowCoordinate[r]) belongs to the subrow i. P(i)⊆S(i) is a set of sextuples (x, $x_{old}$, $r_{old}$, w,n, cr) such that x belongs to one of columns c, c+1, ..., c+1, ..., c+MaxDistance−1. Subrow j of row r has x coordinates that are less than the x coordinates of subrow i, and subrow j is a neighbor of subrow i. If number j exists, c" is set to the maximal number such that the point (ColumnCoordinate [c"], RowCoordinate [r]) belongs to the subrow j.

If number j exists, all the sextuples of P(i) are examined at steps 604–608. Let (x, $x_{old}$, $r_{old}$, w, n, cr) be the currently considered sextuple. At step 606, the movement operation $\Phi$ is selected that moves cell n to row r, column c". At step 608, if $\Phi$ is an acceptable operation, then $\Phi$ and $\Phi_{opt}$ are compared as described above. If $\Phi$ is better than $\Phi_{opt}$ then $\Phi_{opt}$ is set equal to $\Phi$.

At step 610, c' is set as the maximal number such that point (ColumnCoordinate[c'], RowCoordinate[r]) belongs to the subrow i. P'(i)⊆S(i) is a set of sextuples (x, $x_{old}$, $r_{old}$, w, n, cr) such that x belongs to one of columns c'-MaxDistance+1, c'-MaxDistance+2, ..., c'. Subrow j' of row r has x coordinates that are greater than the x coordinates of subrow i, and subrow j' is a neighbor of subrow i. If number j' exists, c" is set to the minimal number such that the point (ColumnCoordinate[c"], RowCoordinate[r]) belongs to the subrow j'.

If number j' exists, then all the sextuples of P'(i) are examined at steps 612-6-6. Let (x, $x_{old}$, $r_{old}$, w, n, cr) be the currently considered sextuple. At step 614, the movement operation $\Phi$ is selected to move cell n to row r, column c". At step 616, if this is an acceptable operation, then $\Phi$ and $\Phi_{opt}$ are compared as described above, and if $\Phi$ is better than $\Phi_{opt}$ then $\Phi_{opt}$ is set equal to $\Phi$.

At step 618, if $\Phi_{opt}=\Phi_0$ after the examination of all the sextuples of P(i) and P'(i) then the procedure returns 0, otherwise the procedure returns $\Phi_{opt}$.

G. Optimal Exchange of Two Cells of Neighbor Subrows of One Row

This process is similar to that described in Section F, and seeks the optimal exchange of, two cells n and n' between neighbor subrows i and j of a single row r. As in the prior cases, the optimal movement operation $\Phi$ is set equal to $\Phi_0$, where $\Phi_0$ is the fictitious movement operation described above. Let c be the minimal number such that point (ColumnCoordinate[c], RowCoordinate[r]) belongs to subrow i, and P(i)⊆S(i) is a set of sextuples (x,$x_{old}$, $r_{old}$, w, n, cr) such that x belongs to one of the column c, c+1, ..., c+MaxDistance−1. Subrow j belongs to the row r, and has x coordinates that are less than the x coordinates of subrow i, and subrow j is a neighbor of subrow i.

If number j exists, then the maximal number d is found such that point (ColumnCoordinate [d], RowCoordinate[r]) belongs to subrow j. This is accomplished from a set Q(j) of sextuples (x,$x_{old}$, $r_{old}$, w, n, cr), where Q(j)⊆S(j), such that x belongs to one of the columns d-MaxDistance+1, d-MaxDistance+2, ..., d. All sextuples of P(i) are examined. With (x, $x_{old}$, $r_{old}$, w, n, cr) the currently considered sextuple, all the sextuples (x, x'$_{old}$, r'$_{old}$, w', n', cr') of Q(j) are examined and the movement operation $\Phi$ is considered such that $\Phi$ exchanges cells n and n'. If $\Phi$ is an acceptable operation then $\Phi$ and $\Phi_{opt}$ are compared as described above. If $\Phi$ is better than $\Phi_{opt}$, $\Phi_{opt}$ is set equal to $\Phi$.

Let c' be the maximal number such that point (ColumnCoordinate[c'], RowCoordinate[r]) belongs to subrow i. P'(i)⊆S(i) is a set of sextuples (x, $x_{old}$, $r_{old}$, w, n, cr) such that x belongs to one of the columns C'-MaxDistance+1, c'-MaxDistance+2, ..., c'. Subrow j' belongs to row r and has x coordinates that are greater than the x coordinates of subrow i, and subrow j' is a neighbor of subrow i.

If number j' exists then the minimal number d' is found such that point (ColumnCoordinate [d'], RowCoordinate[r]) belongs to subrow j'. Q'(j')⊆S(j') is a set of sextuples (x, $x_{old}$, $r_{old}$, w, n, cr) such that x belongs to one of columns d', d'+1, ..., d'+MaxDistance−1. All the sextuples of P'(i) are examined, with (x, $x_{old}$, $r_{old}$, w, n, cr) being the currently considered sextuple. All the sextuples (x', x'$_{old}$, r'$_{old}$, w', n', cr') of Q'(j') are examined, and the movement operation $\Phi$ is considered such that $\Phi$ exchanges the cells n and n'. If $\Phi$ is an acceptable operation and $\Phi$ is better than $\Phi_{opt}$, then set $\Phi_{opt}=\Phi$.

If $\Phi_{opt}=\Phi_0$ after the examination of all the sextuples of P(i) and P'(i) then the procedure returns 0, otherwise the procedure returns $\Phi_{opt}$.

H. Far Movement of Non-critical Cells

Non-critical cells may be moved farther than to neighboring subrows. FIG. 7 is a flow chart of this process. At step 700, if Excess[i]≦0 or set S(i) does not contain any non-critical sextuple, the process ends, where i is the number of the input subrow. Otherwise, at step 702 a non-critical sextuple (x, $x_{old}$, $r_{old}$, w, n, cr)∈S(i) is randomly chosen, i.e., cr=0. Assuming that x belongs to column c, at step 704 all points of the lattice are examined starting from the point (c, r) and moving in a spiral 800 as illustrated in FIG. 8, for example first along row r to point (c−1, r), thence to point (c, r+1), thence to point (c+1, r), thence to point (c, r−1), thence to point (c−2, r), etc. through the lattice. At step 706, if the currently considered point (c', r') belongs to subrow j, and if Excess[j]+w≦0 then cell n is moved to subrow j and the corresponding items of the auxiliary structures, in particular Excess[i], Excess[j], S(i), S(j) and others, are changed.

At step 708 if there are additional non-critical sextuples remaining and Excess[i]>0, the process loops back to step 702 and is repeated for all non-critical sextuples of S(i).

Returning to FIG. 3, the process to remove subrow overflow may be more fully explained. MaxDist is the maximal value of the parameter MaxDistance. In preferred embodiments MaxDist is set equal to 3. MaxNeighborhoodRadius is the maximal value of the parameter NeighborhoodRadius. In preferred embodiments MaxNeighborhoodRadius is set equal to min(RowNumber/3, 10). After the auxiliary structures are: completed at step 300, at step 302 MaxDistance and RoughShiftFlag are initialized to 1 and NeighborhoodRadius is initialized to 0. At step 304, all overflowed subrows are examined using the process to choose optimal movement of cell from overflowed subrow to neighbor row described in Section B and the process to choose optimal exchange of two cells of neighbor rows described in Section C. These processes are applied to each subrow i. If one of these procedures finds some movement operation, then that movement operation is applied to the cell(s) and the corresponding items of the auxiliary structures are changed.

At step 306, if there are overflowed subrows and the procedures to choose the optimal movement operation return 0 for all overflowed subrows in step 304, then the value of NeighborhoodRadius is incremented by 1. At step 308, if the new value of NeighborhoodRadius<MaxNeighborhoodRadius then the process loops back to step 304. (Steps 306 and 308 effectively increase the size of a subrow up to a limit dictated by the value of MaxNeighborhoodRadius.) Otherwise, if at step 310 all overflows have been removed, the process exits at step 312. If all overflows have not been removed, at step 314 if RoughShiftFlag=1 then the process of rough shifting of subrow overflows described in Section E is applied to each subrow, RoughShiftFlag and NeighborhoodRadius are set to 0, and the process loops back to step 304.

If RoughShiftFlag=0 at step 314, then all overflowed subrows are randomly examined. The process to choose optimal movement of a cell from an overflowed subrow to a neighbor subrow described at Section F and the process to choose an optimal exchange of two cells of neighbor subrows described at Section G is applied if both subrows belong to one row. At step 316, if a movement operation is found, the operation is applied and the corresponding items of the auxiliary structures are changed.

At step 318, if overflowed subrows are removed, the process ends. If at step 318 overflowed subrows remain and the procedures applied at step 316 return 0 for all overflowed subrows, then MaxDistance is set equal to MaxDistance+1. At step 320, if MaxDistance≦MaxDist, RoughShiftFlag is set to 0, NeighborhoodRadius is set to 1, and the process loops back to step 304.

If at step 320 MaxDistance>MaxDist, the process of far movement of non-critical cells described at Section H is applied at step 322 to all subrows, and the process ends.

In most cases, the process to choose optimal movement of a cell from an overflowed subrow to a neighbor row and the process to choose an optimal exchange of two cells of neighbor rows, applied in step 304 allow selection of a vertical movement operation. For most designs these processes are all that is necessary to remove all overflows. Step 314 is usually necessary only if the design has many blockages and fixed cells. Step 320 is rarely executed.

I. Placement of Dual Height Cells

It is important to correctly place the dual height cells of the chip. A dual height cell is placed in two neighbor rows if their outlines have a common horizontal side. As describe above, a dual height cell is a pair of half-cells, and each half-cell is placed in one row. Overlap removal is applied to each row of the chip independently. As a result, there are no cell overlaps in the rows but some half-cells corresponding to a dual height cell might have different x coordinates. The following is a process that finds permutations of the elements of two neighbor rows such that the x coordinates of each half-cell corresponding to one dual height cell become equal and the total distance between the initial and new positions of the cells of these rows is minimized.

The overlap remover described above treats each cell as a rectangle $(x_1, y_1, x_2, y_2)$, called the outline of the cell. The value $x_2-x_1$ is the width of the cell. The value $y_2-y_1$ is the height of the cell. Usually all ordinal cells have the same height. The width of the cells may be different.

Each row has a specific characteristic called an angle. An angle can be equal to 0° or 180°. The angles of all ordinal cells belonging to some row must be equal to the angle of the row. Two rows $(X_1, Y_1, X_2, Y_2)$ and $(\tilde{X}_1, \tilde{Y}_1, \tilde{X}_2, \tilde{Y}_2)$ are neighbors if $Y_2=\tilde{Y}_1$, $X_1<\tilde{X}_2$, $\tilde{X}_1<X_2$, the angle of the first row is 180°, and the angle of the second row is 0°. A dual height cell may be placed only in two neighbor rows. A pair of the rows is suitable if these rows are neighbors and a dual height cell is placed in these rows.

Consider a suitable pair of rows and a dual height cell placed in these rows. The above described overlap remover presents a dual height cell as two rectangles (so-called half-cells) such that each rectangle has the height equal to the height of the row, the first rectangle is placed in the first row of the pair, and the second rectangle is placed in the second row. Trying to remove cell overlaps in these rows the overlap remover is applied to each row of the pair independently. After this step no cell overlaps inside the rows but some half-cells corresponding to a dual height cell can have different x coordinates.

A permutation of elements of a suitable pair is called correct if after this permutation the x coordinates of half-cells corresponding to this dual height cell become equal. A correct permutation permits cells and half-cells inside rows.

The problem is to find a correct permutation of elements of a row pair. An example where a correct permutation does not exist is given in FIG. 9, where row r contains ordinal cell 900 and half-cells 902 and 904 of dual-height cells 2 and 3, and row r' contains ordinal cell 906 and half-cells 908 and 910 of dual-height cells 2 and 3. In this case, no shifting of cells will permit alignment of cell 902 to cell 908 or of cell 904 to cell 910.

A pair of neighbor rows $(X_1, Y_1, X_2, Y_2)$, $(\tilde{X}_1, \tilde{Y}_1, \tilde{X}_2, \tilde{Y}_2)$ is aligned if $X_1=\tilde{X}_1$ or $X_2=\tilde{X}_2$. If a suitable pair $(X_1, Y_1, X_2, Y_2)$, $(\tilde{X}_1, \tilde{Y}_1, \tilde{X}_2, \tilde{Y}_2)$ is aligned then a correct permutation does exist. Indeed, if $X_1=\tilde{X}_1$ then all the dual height cells can be moved to the left parts of the rows and place the ordinal cells after (to the right of) the dual height cells. In the case $X_2=\tilde{X}_2$ all dual height cells can be moved to the right parts of the rows. An example of a correct permutation of elements of a row pair is given in FIG. 10. Here, half-cells 1000 and 1002 of row r and half-cells 1004 and 1006 in row r', which form dual-height cells 2 and 3, can be shifted to the left of ordinal cells 1008 and 1010 to align the half-cells.

If a suitable pair is aligned a correct permutation can be found. Moreover, the total distance between initial positions of the cells of the pair and new positions of the cells is close to the minimum among corresponding total distances of all correct permutations.

A triple (x, w, n) is assigned to each cell or half-cell($x_1$, $y_1$, $x_2$, $y_2$), where $x=x_1$, $w=x_2-x_1$, and n is the cell number in the chip cell list. A suitable pair R of rows ($X_1$, $Y_1$, $X_2$, $Y_2$) and ($\tilde{X}_1$, $\tilde{Y}_1$, $\tilde{X}_2$, $\tilde{Y}_2$) are selected. Two lists $L_1=\{(x_1, w_1, n_1), \ldots, (x_{m_1}, w_{m_1}, n_{m_1})\}$ and $L_2=\{(\tilde{x}_1, \tilde{w}_1, \tilde{n}_1), \ldots, (\tilde{x}_{m_2}, \tilde{w}_{m_2}, \tilde{n}_{m_2})\}$ are assigned to the pair R, where $m_1$, $m_2$ are the numbers of the cells and half-cells of the first and second rows of the pair respectively, $L_1$ is the list of the triples corresponding to the cells and half-cells of the first row and $x_1 < x_2 < \ldots < x_{m_1}$, $L_2$ is the list of the triples corresponding to the cells and half-cells of the second row and $\tilde{x}_1 < \tilde{x}_2 < \ldots < \tilde{x}_{m_2}$. $P_1$ and $P_2$ are permutations of the lists $L_1$ and $L_2$ respectively such that $$P_1(L_1) = \{(x_{p_1}, w_{p_1}, n_{p_1}), \ldots, (x_{p_{m_1}}, w_{p_{m_1}}, n_{p_{m_1}})\} \text{ and}$$

$$P_2(L_2) = \{(\tilde{x}_r, \tilde{w}_{r_1}, \tilde{n}_{r_1}), \ldots, (\tilde{x}_{r_{m_1}}, \tilde{w}_{r_{m_2}}, \tilde{n}_{r_{m_2}})\}.$$

These permutations are expressed as $P_1=(p_1, \ldots, p_{m_1})$ and $P_2=(r_1, \ldots, r_{m_2})$. The assumption is made that the orders of the dual height cells in both rows after the action of the permutations $P_1$ and $P_2$ coincide. Let $$(x_{p_{k_1}}, w_{p_{k_1}}, n_{p_{k_1}})$$

be the first triple corresponding to a dual height cell in the list $P_1(L_1)$, and $$(\tilde{x}_{r_{k_2}}, \tilde{w}_{r_{k_2}}, \tilde{n}_{r_k})$$

be the first triple corresponding to a dual height cell in the list $P_2(L_2)$. By assumption, $$n_{p_{k_1}} = \tilde{n}_{r_{k_2}} = n.$$

Let x be a desirable position of the cell n (for example, consider $$x = (x_{p_{k_1}} + \tilde{x}_{r_{k_2}})/2).$$

The triple $V=(P_1(L_1), P_2(L_2), x)$ is called a version of the pair R.

Four values are calculated for a version V of pair R:

$$BeforeFreeSpace_1(V) = x - X_1 - \sum_{i=1}^{k_1-1} w_{p_i},$$

$$AfterFreeSpace_1(V) = X_2 - x - \sum_{i=k_1}^{m_1} w_{p_i},$$

$$BeforeFreeSpace_2(V) = x - \tilde{X}_1 - \sum_{i=1}^{k_2-1} \tilde{w}_{r_i}, \text{ and}$$

$$AfterFreeSpace_2(V) = \tilde{X}_2 - x - \sum_{i=k_2}^{m_2} \tilde{w}_{r_i}.$$

Since there are no overflows in the rows, $BeforeFreeSpace_1(V)+AfterFreeSpace_1(V) \geq 0$, and $BeforeFreeSpace_2(V)+AfterFreeSpace_2(V) \geq 0$.

A version V is "good" if $BeforeFreeSpace_1(V) \geq 0$, $BeforeFreeSpace_2(V) \geq 0$, $AfterFreeSpace_2(V) \geq 0$, and $$x_{p_1} < x_{p_2} < \ldots < x_{p_{k_1-1}}, x_{p_{k_1+1}} < x_{p_{k_1+2}} < \ldots < x_{p_{m_1}},$$

$$\tilde{x}_{r_1} < \tilde{x}_{r_2} < \ldots < \tilde{x}_{r_{k_2-1}}, \tilde{x}_{r_{k_2+1}} < \tilde{x}_{r_{k_2+2}} < \ldots < \tilde{x}_{r_{m_2}}.$$

1. Calculation of a Penalty

The penalty of a version is calculated using a version $V=(L_1, L_2, x)$ of a suitable pair R of rows as an input. If $L_1=\{(x_1, w_1, n_1), \ldots, (x_m, w_m, n_m)\}$ and $(x_k, w_k, n_k)$ is the first triple corresponding to a dual height cell in list $L_1$, set $$x'_i = \min\left\{x_{i'}x - \sum_{j=1}^{k-1} w_j\right\}$$

for i=1, ..., k-1; $X'_k=x$; and $$x'_i = \max\left\{x + \sum_{j=k}^{i-1} w_j, x_i\right\}$$

for i=k+1, ..., m. The defined value $x'_1$ is the new position of the i-th triple of the list $L_1$. The distance between old and new positions is $$Penalty_1 = \sum_{i=1}^{m} |x_i - x'_i|.$$

The new positions of the cells of the second row of the pair and $$Penalty_2 = \sum_{i=1}^{m} |\tilde{x}_i - \tilde{x}'_i|$$

is calculated in a similar fashion. The value $Penalty_1+Penalty_2$ is the penalty of version V of the pair R.

2. Moving an Ordinal Cell

The movement of one ordinal cell is calculated from a version $V=(L_1, L_2, x)$ of a suitable pair R of rows, the current optimal version $V_{opt}$ of the pair R, and the penalty $Pen_{opt}$ of the version $V_{opt}$. If $L_1=\{(x_1, w_1, n_1), \ldots, (x_{m_1}, w_{m_1}, n_{m_1})\}$, $L_2=\{(\tilde{x}_1, \tilde{w}_1, \tilde{n}_1), \ldots, (\tilde{x}_{m_2}, \tilde{w}_{m_2}, \tilde{n}_{m_2})\}$, assume $(x_{k_1}, w_{k_1}, n_{k_1})$ is the first triple corresponding to a dual height cell in list $L_1$, and $(\tilde{x}_{k_2}, \tilde{w}_{k_2}, \tilde{n}_{k_2})$ is the first triple corresponding to a dual height cell in list $L_2$. Assume also that $P_1$ and $P_2$ are the identical permutations, i.e. $P_1=(1, 2, \ldots, m_1)$, $P_2=(1, 2, \ldots, m_2)$. If $BeforeFreeSpace_1(V) \geq 0$, and $AfterFreeSpace_1(V) \geq 0$, and $BeforeFreeSpace_2(V) \geq 0$, and $AfterFreeSpace_2(V) \geq 0$ exit from the procedure.

Initially, an attempt is made to move an ordinal cell to the right if $BeforeFreeSpace_1(V)>0$ and $BeforeFreeSpace_2(V) \leq 0$, or if $BeforeFreeSpace_2(V)>0$ and $BeforeFreeSpace_1(V) \leq 0$. Set n=1 if $BeforeFreeSpace_1(V) \leq 0$ and set n=2 otherwise. It is clear that $AfterFreeSpace_n(V) \geq 0$. Set $n'=\max(0, -AfterFreeSpace_{3-n}(V))$. A value of $n'>0$ means the dual height cell $n_{k_1}$ should be moved left by n' to increase $AfterFreeSpace_{3-n}(V)$.

Set $W_{max}$=AfterFreeSpace$_n$(V). If the width of the ordinal cell is more than $W_{max}$ then this cell can not be moved right, because AfterFreeSpace$_n$(V) becomes less than 0.

Set $W_{min}$=BeforeFreeSpace$_n$(V)=n'. If the width of the ordinal cell is less than $W_{min}$ then this cell can not be moved right, because BeforeFreeSpace$_n$(V) or AfterFreeSpace$_{3-n}$(V) remains less than 0.

If $W_{max} \geq W_{min}$ the triples of list $L_n$ are examined starting from i=$k_n$-1 and moving to 1. If $w_i \leq W_{max}$ and $w_i \geq W_{min}$ then a suitable cell is found. Set $P_n$=(1, . . . , i-1, i+1, . . . , $k_n$, i, $k_n$+1, . . . , $m_n$), and apply calculate the penalty of version V'=($P_1(L_1)$, $P_2(L_2)$, x-n'). Let Pen' be the result of this procedure. If Pen'<$Pen_{opt}$ then set $Pen_{opt}$=Pen' and $V_{opt}$=V'. Then the loop is ended. The output of this step is $Pen_{opt}$ and $V_{opt}$.

If $W_{max}$<$W_{min}$, or $W_i$<$W_{min}$ or $w_i$>$W_{nax}$ for all i=1, . . . , $k_n$-1 a suitable cell can not be found to move right. Accordingly, set $P_1$=(1, 2, . . . , $m_1$), $P_2$=(1, 2, . . . , $m_2$) and try to move an ordinal cell left in a similar manner.

3. Moving a Dual Height Cell

A dual height cell is moved using a suitable pair R. Let $L_1$={($x_1$, $w_1$, $n_1$), . . . , ($x_{m_1}$, $w_{m_1}$, $n_{m_1}$)} and $L_2$={($\tilde{x}_1$, $\tilde{w}_1$, $\tilde{n}_1$), . . . , ($\tilde{x}_{m_2}$, $\tilde{w}_{m_2}$, $\tilde{n}_{m_2}$)} be the lists corresponding to the pair R, and assume that the orders of the numbers of the dual height cells in both lists are the same. Let ($x_{k_1}$, $w_{k_1}$, $n_{k_1}$) be the first triple corresponding to a dual height cell in list $L_1$ and ($\tilde{x}_{k_2}$, $\tilde{w}_{k_2}$, $\tilde{n}_{k_2}$) be the first triple corresponding to a dual height cell in list $L_2$. By assumption $n_{k_1}$=$\tilde{n}_{k_2}$=n.

The current optimal good version is $V_{opt}$, the penalty of version $V_{opt}$ is $Pen_{opt}$, the current penalty is $Pen_{cur}$, the current version is V, and a permutation is P. The process is illustrated in the flow chart of FIG. 11.

At step 1100, $Pen_{opt}$ and $Pen_{cur}$ are initialized at 0.

First, an attempt will be made to move dual height cell n to the left. At step 1102, set x=($x_{k_1}$+$\tilde{x}_{k_2}$)/2, V=($L_1$, $L_2$, x), $b_1$=BeforeFreeSpace$_1$(V), $b_2$=BeforeFreeSpace$_2$(V), $a_1$=AfterFreeSpace$_1$(V), $a_2$=AfterFreeSpace$_2$(V), and at step 1104 set mb=min{$b_1$, $b_2$}, and ma=min{$a_1$, $a_2$}. If, at step 1106, ma$\geq$0 and mb$\geq$0 then the current version V is a good version. The penalty, Pen, of version V is calculated. If Pen+$Pen_{cur}$<$Pen_{opt}$, set $Pen_{opt}$=Pen+$Pen_{cur}$ and $V_{opt}$=V and exit from the procedure.

If mb>0 dual height cell n can be moved left. At step 1108 set d=-ma if -ma<mb and d=mb otherwise. Set x=x-d, $Pen_{cur}$=$Pen_{cur}$+2d to move dual height cell n left by d. If $Pen_{cur} \geq Pen_{opt}$, exit from the procedure because version $V_{opt}$ is better than version V. Otherwise set $b_1$=$b_1$-d, $b_2$=$b_2$-d, $a_1$=$a_1$+d, $a_2$=$a_2$+d and return to step 1104.

At step 1110 the process to move one ordinal cell described in section 2 is applied to versions V=($L_1$, $L_2$, x), $V_{opt}$ and penalty $Pen_{opt}$. Set ChangeFlag=0, and the placement of the ordinal cells with respect to the dual height cell is identified. If $b_1$>0 and $a_1$<0 then the triples of the list $L_1$ are examined starting from $k_1$+1 to find the first triple corresponding to an ordinal cell. If this triple exists it is denoted by j. If $w_j \leq b_1$ set P=(1, . . . , $k_1$-1, j, $k_1$, . . . , j-1, j+1, . . . , $m_1$), $b_1$=$b_1$-$w_j$, $a_1$=$a_1$+$w_j$, $L_1$+P($L_1$), and ChangeFlag=1. This means that the ordinal cell $n_j$ is placed before the dual height cell n.

If $b_2$>0 and $a_2$<0 then the triples of list $L_2$ are examined starting from $k_2$+1 to find the first triple corresponding to an ordinal cell. If this triple exists it is denoted by j. If $\tilde{w}_j \leq b_2$ then P=(1, . . . , $k_2$-7, j, $k_2$, . . . , j-1, j+1, . . . , $m_2$), $b_2$=$b_2$-$\tilde{w}_j$, $a_2$=$a_2$+$\tilde{w}_j$, $L_2$=P($L_2$), and ChangeFlag=1. This means that the ordinal cell $\tilde{n}_j$ is placed before the dual height cell n. If ChangeFlag=1 then return to step 1104.

If $b_1 \leq 0$ and $k_1$>1 then set P=(1, . . . , $k_1$-2, $k_1$, $k_1$-1, . . . , $m_1$), $b_1$=$b_1$+$\tilde{w}_{k_1-1}$, $a_1$=$a_1$-$\tilde{w}_{k_1-1}$, $L_1$=P($L_1$) and ChangeFlag=1. This means that the ordinal cell $\tilde{n}_{k_1-1}$ is placed after the dual height cell n.

If $b_2 \leq 0$ and $k_2$>1 then set P=(1, . . . , $k_2$-2, $k_2$, $k_2$-1, $m_2$), $b_2$=$b_2$+$\tilde{w}_{k_2-1}$, $a_2$=$a_2$-$\tilde{w}_{k_2-1}$, $L_2$=P($L_2$) and ChangeFlag=1. This means that the ordinal cell n is placed after the dual height cell n. If ChangeFlag=1 then return to step 1104. If ChangeFlag=0, exit from the procedure. The results of this procedure are output at step 1112 as $Pen_{opt}$ and $V_{opt}$.

The initial lists $L_1$ and $L_2$, and the values $k_1$, $k_2$ are restored and the process is repeated to try to move the dual height cell n right in a similar way.

A result of $Pen_{opt}$=$\infty$ means that a good version of the pair R cannot be found. It is clear that if the pair R is aligned then $Pen_{opt}$<$\infty$. If $Pen_{opt}$<$\infty$ then $V_{opt}$=($L_1$, $L_2$, x) is a good version of the pair R, $V_{opt}$ have the minimal (or close to minimal) penalty, the half-cells corresponding to the dual height cell n are aligned, and their positions are equal to x.

4. Placement of Dual Height Cells

FIG. 12 is a flow chart of this procedure. At step 1200, the procedure for movement of a dual height cell described in Section 3 is applied to each suitable pair R of the rows ($X_1$, $Y_1$, $X_2$, $Y_2$), $\tilde{X}_1$, $\tilde{Y}_1$, $\tilde{X}_2$, $\tilde{Y}_2$). At step 1202, if $Pen_{opt}$=$\infty$ then a legal placement for the first dual height cell of pair R cannot be made so this cell is removed from pair R. If at step 1204 R remains to be suitable the procedure for movement of a dual height cell of Section 3 is applied to pair R again. If $Pen_{opt}$<$\infty$ at step 1206, calculate new coordinates of all cells for the version $V_{opt}$=($L_1$, $L_2$, x) as described in procedure to calculate a penalty in Section 1 above and set these new coordinates. Set $L_1$={($x_1$, $w_1$, $n_1$), . . . , ($x_{m_1}$, $w_{m_1}$, $n_{m_1}$)} and $L_2$={($\tilde{x}_1$, $\tilde{w}_1$, $\tilde{n}_1$), . . . , ($\tilde{x}_{m_2}$; $\tilde{w}_{m_2}$, $\tilde{n}_{m_2}$)}. Let ($x_{k_1}$, $w_{k_1}$, $n_{k_1}$) be the first triple corresponding to a dual height cell in list $L_1$, and ($\tilde{x}_{k_2}$, $\tilde{w}_{k_2}$, $\tilde{n}_{k_2}$) be the first triple corresponding to a dual height cell in list $L_2$. It is clear that $x_{k_1}$=$\tilde{x}_{k_2}$=x. At step 1208, a new pair R' of aligned rows (x+$w_{k_1}$, $Y_1$, $X_2$, $Y_2$) and (x+$\tilde{w}_{k_1}$, $\tilde{Y}_1$, $\tilde{X}_2$, $\tilde{Y}_2$) is considered. Lists L'$_1$={($x_{k_1+1}$, $w_{k_1+1}$, $n_{k_1+1}$), . . . , ($x_{m_1}$, $w_{m_1}$, $n_{m_1}$)} and L'$_2$={($\tilde{x}_{k_2+1}$, $\tilde{w}_{k_2+1}$, $n_{k_2+1}$), . . . , ($\tilde{x}_{m_2}$, $\tilde{w}_{m_2}$, $\tilde{n}_{m_2}$)} are assigned to pair R'. If R' is a suitable pair then the procedure for movement of a dual height cell is applied to pair R' again while R' is a suitable pair.

Legal placement of the chip is achieved after consideration of all suitable pairs of rows.

The present invention thus provides processes for placement of cells in integrated circuit chips to remove cell overlap, row overflow and optimize the placement of dual height cells. The invention is particularly useful in hierarchical design processes where dual height cells are employed.

In preferred embodiments, the invention is carried but by a computer operating under the control of a computer readable program. A memory medium, such as a recording disk of a disk drive, contains the computer readable program consisting of computer readable program code that defines the parameters of the process and of the chip and cells and controls the computer to carry out the processes of the invention.

Although the present invention has been described with reference to preferred embodiments, workers skilled in the art will recognize that changes may be made in form and detail without departing from the spirit and scope of the invention.

What is claimed is:

1. A process for placing cells in rows of an integrated circuit chip layout during a cell placement procedure for the chip, the integrated circuit having a plurality of functions, comprising steps of:

a) partitioning the rows into subrows;

b) placing only cells having a common characteristic vector into a subrow; and c) sorting the cells for optimal placement by c1) removing cell overflow from each of the subrows, and c2) if cells are overlapped in subrows, removing cell overlap from each of the subrows containing cell overlap.

2. The process of claim 1, wherein step (c2) comprises:

c2a) assigning first auxiliary structures to each cell of a subrow and a second auxiliary structure to each subrow, c2b) identifying an overflowed subrow based on the second auxiliary structures, and c2c) moving at least one cell from an overflowed subrow using the first auxiliary structure to remove overflow.

3. The process of claim 2, wherein step (c2) further includes:

c2d) if overflow removal is not completed in step (c2c), removing at least one non-critical cell from the function to remove overflow.

4. The process of claim 1, further including, after step (c2), c3) adjusting the positions of half-cells of dual height cells in adjacent rows for minimal offset of the half-cells.

5. A process for placing cells in rows of an integrated circuit chip layout during a cell placement procedure for the chip, the integrated circuit having a plurality of functions, wherein the cells are arranged by function, with each function being assigned an area of the chip, the process comprising steps of:

a) partitioning the rows into subrows;

b) placing only cells having a common characteristic vector into a subrow;

c) sorting the cells for optimal placement by;

c1) removing cell overflow from each of the subrows, and c2) if cells are overlapped in subrows, removing cell overlap from each of the subrows containing cell overlap; and d) assuring that the function area is adequate to receive the cells of the function.

6. The process of claim 5, wherein step (d) comprises:

d1) identifying a total, SumWidth(i), of the widths of all cells, d2) identifying a total, SumArea(i), of the widths of all subrows, and d3) if SumWidth(i)>SumArea(i), removing non-critical cells from the function until SumWidth(i)≦SumArea(i).

7. A process for placing cells in rows of an integrated circuit chip layout during a cell placement procedure for the chip, wherein a first cell in a first row is a first half-cell of a dual height cell having a second half-cell in a second row adjacent the first row, the process comprising steps of:

a) moving the half-cells to cell positions in a pair of rows;

b) calculating a penalty based, on a distance between the half-cells of a dual height cell before and after the move of step (a);

c) removing a dual height cell from the pair of rows if the penalty calculated in step (b) is not acceptable;

d) calculating new row: coordinates for the half-cells in the pair of rows if the penalty is acceptable after step (c);

e) aligning the pair of rows to minimize the penalty; and f) moving the half-cells of the dual height cells to cell positions in the pair of rows to minimize the penalty.

8. The process of claim 7, wherein step (f) includes f1) placing an ordinal cell in a first row before a first half-cell of the dual height cell if the width of the ordinal cell is not greater than a free space before the first half-cell, f2) placing an ordinal cell in a second row before a second half-cell of the dual height cell if the width of the ordinal cell is not greater than a free space before the second half-cell, the first and second rows being adjacent, f3) placing an ordinal cell in the first row after the first half-cell if the free space before the first half-cell is not greater than zero, and f4) placing an ordinal cell in the second row after the second half-cell if the free space before the second half-cell is not greater than zero.

9. The process of claim 8, wherein step (f2) includes moving the ordinal cell from a position after the second half-cell to a position before the second half-cell and step (f3) includes moving the ordinal cell from a position before the first half-cell to a position- after the first half-cell.

10. A process for placing cells in rows of an integrated circuit chip layout during a cell placement procedure for the chip, the integrated circuit having a plurality of functions, comprising steps of:

a) partitioning the rows into subrows;.

b) placing only cells having a common characteristic vector into a subrow; and c) removing overflows of cells from a row by steps of:

c1) choosing a movement for at least one cell in each overflowed subrow;

c2) incrementing the size of each subrow containing overflows;

c3) repeating step (c1) for another movement if the incremented size of the subrows exceeds a maximum size; and c4) performing the movement if the incremented size of the subrows does not exceed the maximum size and the overflows are removed.

11. The process of claim 10, further including steps of:

c5) rough shifting subrow overflows if the incremented size of the subrows does not exceed the maximum size and the overflows are not removed, c6) performing the movement if the overflows are removed, and c7) repeating steps (c1)–(c6) if the incremented size of the subrows does not exceed the maximum size and the overflows are not removed.

12. The process of claim 11, further including steps of:

c8) choosing a movement for non-critical cells to available positions; and c9) performing the movement.

13. The process of claim 10, wherein step (c1) includes selecting a movement from the group of movements consisting of moving a cell from an overflowed subrow to a neighbor row, moving a cell from an overflowed subrow to another subrow of the same row, exchanging two cells between neighbor rows, and exchanging two cells between neighbor subrows of the same row.

14. A computer readable medium having a computer readable program embodied therein for addressing data to place cells in rows of an integrated circuit chip during a computer cell placement procedure for the chip, the computer readable program comprising:

first computer readable program code for causing the computer to partition the rows into subrows;

second computer readable program code for causing the computer to place only cells having a common characteristic vector into a subrow; and third computer readable program code for causing the computer to sort the cells for optimal placement, including fourth computer readable program code for causing the computer to remove cell overflow from each of the subrows;

fifth computer readable program code for causing the computer to remove cell overlap from each of the subrows containing cell overlap.

15. The computer readable medium of claim 14, wherein the fifth computer readable code comprises:

sixth computer readable program code for causing the computer to assign first auxiliary structures to each cell of a subrow and a second auxiliary structure to each subrow, seventh computer readable program code for causing the computer to identify an overflowed subrow based on the second auxiliary structures, and eighth computer readable program code for causing the computer to move at least one cell from an overflowed subrow using the first auxiliary structure to remove overflow.

16. The computer readable medium of claim 15, wherein the fifth computer readable code further includes:

ninth computer readable program code for causing the computer to identify if an overflow condition exists after operation of the computer under control of the eighth computer readable program code, and tenth computer readable program code responsive to the computer operation on the ninth computer readable program code for causing the computer to remove at least one non-critical cell from the function to remove overflow.

17. The computer readable medium of claim 14, wherein the computer readable program further includes:

sixth computer readable program code for causing the computer to adjust the positions of half-cells of dual height cells in adjacent rows for minimal offset of the half-cells.

18. A computer readable medium having a computer readable program embodied therein for addressing data to place cells in rows of an integrated circuit chip during a computer cell placement procedure for the chip, the computer readable program comprising:

first computer readable program code for causing the computer to partition the rows into subrows;

second computer readable program code for causing the computer to place only cells having a common characteristic vector into a subrow;

third computer readable program code for causing the computer to sort the cells for optimal placement;

fourth computer readable program code for causing the computer to identify if a total of the widths of all cells, SumWidth(i), is greater than a total of the widths of all subrows, SumArea(i); and fifth computer readable program code responsive to the computer operating under control of the fourth computer readable program code for causing the computer to remove non-critical cells from the function until SumWidth(i)≦SumArea(i).

19. A computer readable medium having a computer readable program embodied therein for addressing data to place cells in rows of an integrated circuit chip during a computer cell placement procedure for the chip, wherein a first cell in a first row is a first half-cell of a dual height cell having a second half-cell in a second row adjacent the first row, the computer readable program comprising:

first computer readable program code for causing the computer to move the half-cells of dual height cells to cell positions in a suitable pair of rows;

second computer readable program code for causing the computer to calculate a penalty based on a distance between the half-cells of a dual height cell before and after the move;

third computer readable program code for causing the computer to remove a dual height cell from the pair of rows if the calculated penalty is not acceptable;

fourth computer readable program code for causing the computer to calculate new row coordinates for the half-cells in the pair of rows if the penalty is acceptable;

fifth computer readable program code for causing the computer to align the pair of rows to minimize the penalty; and sixth computer readable program code for causing the computer to move the half-cells of the dual height cells to cell positions in the pair of rows to minimize the penalty.

20. The computer readable medium of claim 19, wherein the sixth computer readable program code causes the computer a) to place an ordinal cell in a first row before a first half-cell of the dual height cell if the width of the ordinal cell is not greater than a free space before the first half-cell, b) to place an ordinal cell in a second row before a second half-cell of the dual height cell if the width of the ordinal cell is not greater than a free space before the second half-cell, the first and second rows being adjacent, c) to place an ordinal cell in the first row after the first half-cell if the free space before the first half-cell is not greater than zero, and d) to place an ordinal cell in the second row after the second half-cell if the free space before the second half-cell is not greater than zero.

21. The computer readable medium of claim 20, wherein the sixth computer readable program code causes the computer to place the ordinal cell in the second row before the second half cell by moving the ordinal cell from a position after the second half-cell to a position before the second half-cell and causes the computer to place the ordinal cell in the first row before the first half cell step by moving the ordinal cell from a position before the first half-cell to a position after the first half-cell.

22. A computer readable medium having a computer readable program embodied therein for addressing data to place cells in rows of an integrated circuit chip during a computer cell placement procedure for the chip, the computer readable program comprising:

first computer readable program code for causing the computer to partition the rows into subrows;

second computer readable program code for causing the computer to place only cells having a common characteristic vector into a subrow;

third computer readable program code for causing the computer to choose a movement for at least one cell in each overflowed subrow;

fourth computer readable program code for causing the computer to increment the size of each subrow containing overflows;

fifth computer readable program code for causing the computer to repeat operation under control of the third computer readable program code for another movement if the incremented size of the subrows exceeds a maximum size; and sixth computer readable program code for causing the computer to perform the movement if the incremented size of the subrows does not exceed the maximum size and the overflows are removed.

23. The computer readable medium of claim 22, wherein the computer readable program further includes:

seventh computer readable program code for causing the computer to rough shift subrow overflows if the incremented size of the subrows does not exceed the maximum size and the overflows are not removed, eighth computer readable program code for causing the computer to perform the movement if the overflows are removed, and ninth computer readable program code for causing the computer to repeat operation of the computer under control of the third through eighth computer readable program codes if the incremented size of the subrows does not exceed the maximum size and the overflows are not removed.

24. The computer readable medium of claim 23, wherein the computer readable program further includes:

tenth computer readable program code for causing the computer to choose a movement for non-critical cells to available positions; and eleventh computer readable program code for causing the computer to perform the movement.

25. The computer readable medium of claim 22, wherein the third computer readable program code causes the computer to select a movement from the group of movements consisting of moving a cell from an overflowed subrow to a neighbor row, moving a cell from an overflowed subrow to another subrow of the same row, exchanging two cells between neighbor rows, and exchanging two cells between neighbor subrows of the same row.

* * * * *